(12) United States Patent
Yamazaki et al.

(10) Patent No.: US 7,759,686 B2
(45) Date of Patent: Jul. 20, 2010

(54) LIGHT EMITTING DEVICE

(75) Inventors: Shunpei Yamazaki, Setagaya (JP);
Satoshi Seo, Kawasaki (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 9 days.

(21) Appl. No.: 11/907,425

(22) Filed: Oct. 12, 2007

(65) Prior Publication Data

US 2008/0116788 A1 May 22, 2008

Related U.S. Application Data

(60) Continuation of application No. 11/041,576, filed on Jan. 25, 2005, now Pat. No. 7,282,734, which is a division of application No. 10/288,547, filed on Nov. 6, 2002, now Pat. No. 6,876,007.

(30) Foreign Application Priority Data

Nov. 22, 2001 (JP) .............................. 2001-358444

(51) Int. Cl.
*H01L 29/18* (2006.01)
(52) U.S. Cl. .................................. 257/88; 257/E51.022
(58) Field of Classification Search .................. 257/40, 257/79–103, 642, 759, E51.022
See application file for complete search history.

(56) References Cited

U.S. PATENT DOCUMENTS 4,678,285 A 7/1987 Ohta et al.

(Continued)

FOREIGN PATENT DOCUMENTS

CN 1294375 5/2001

(Continued)

OTHER PUBLICATIONS

Tang.C et al., "Organic Electroluminescent Diodes,", Appl. Phys. Lett. (Applied Physics Letters), Sep. 21, 1987, vol. 51, No. 12, pp. 913-915.

(Continued)

*Primary Examiner*—Brook Kebede
(74) *Attorney, Agent, or Firm*—Eric J. Robinson; Robinson Intellectual Property Law Office, P.C.

(57) ABSTRACT

A light emitting device is provided, which uses alternating current drive as a method of driving the light emitting device, and in which light emission is always obtained when voltages having different polarities are alternately applied, and a method of manufacturing the light emitting device is also provided. A first light emitting element made from an anode, an organic compound layer, and a cathode, and a second electrode made from an anode, an organic compound layer, and a cathode are formed. The light emitting elements are formed sandwiching the same organic compound layer. The anode of the first light emitting element and the anode of the second light emitting element, and the cathode of the first light emitting element and the cathode of the second light emitting element, are formed on opposite sides of the organic compound layer, respectively, thus sandwiching the organic compound layer. Note that voltages having an inverse polarity are applied alternately by the alternating current drive, and therefore light can always be emitted by any one of the first light emitting element or the second light emitting element.

13 Claims, 17 Drawing Sheets

U.S. PATENT DOCUMENTS

| | | | |
|---|---|---|---|
| 5,319,480 | A | 6/1994 | McCartney |
| 5,552,678 | A | 9/1996 | Tang et al. |
| 5,717,474 | A | 2/1998 | Sarma |
| 5,748,276 | A | 5/1998 | Uno et al. |
| 5,834,894 | A | 11/1998 | Shirasaki et al. |
| 5,937,272 | A | 8/1999 | Tang |
| 5,982,345 | A | 11/1999 | Takayama et al. |
| 6,057,647 | A | 5/2000 | Kurosawa et al. |
| 6,114,715 | A | 9/2000 | Hamada |
| 6,147,451 | A | 11/2000 | Shibata et al. |
| 6,166,489 | A | 12/2000 | Thompson et al. |
| 6,297,516 | B1 | 10/2001 | Forrest et al. |
| 6,384,529 | B2 | 5/2002 | Tang et al. |
| 6,400,426 | B1 * | 6/2002 | Yamazaki et al. ............. 349/43 |
| 6,525,466 | B1 | 2/2003 | Jabbour et al. |
| 6,538,390 | B2 | 3/2003 | Fujita et al. |
| 6,545,424 | B2 | 4/2003 | Ozawa |
| 6,608,620 | B1 | 8/2003 | Suzuki et al. |
| 6,611,108 | B2 | 8/2003 | Kimura |
| 6,698,077 | B2 | 3/2004 | Buchwalter et al. |
| 6,768,482 | B2 | 7/2004 | Asano et al. |
| 6,809,710 | B2 | 10/2004 | Prache et al. |
| 6,872,973 | B1 | 3/2005 | Koyama et al. |
| 6,882,102 | B2 * | 4/2005 | Yamazaki .................. 313/504 |
| 6,909,413 | B2 | 6/2005 | Nanno et al. |
| 6,965,365 | B2 | 11/2005 | Nakamura |
| 7,030,847 | B2 * | 4/2006 | Kimura ...................... 345/92 |
| 7,084,848 | B2 | 8/2006 | Senda et al. |
| 7,113,154 | B1 * | 9/2006 | Inukai ......................... 345/76 |
| 2002/0014834 | A1 | 2/2002 | Uchida et al. |
| 2002/0021479 | A1 | 2/2002 | Scalora et al. |
| 2002/0024493 | A1 | 2/2002 | Ozawa et al. |
| 2002/0030443 | A1 | 3/2002 | Konuma et al. |
| 2002/0070662 | A1 | 6/2002 | Moriyama et al. |
| 2002/0084993 | A1 | 7/2002 | Taneya et al. |
| 2002/0158288 | A1 * | 10/2002 | Yamazaki et al. ........... 257/343 |
| 2002/0180350 | A1 | 12/2002 | Furugori et al. |
| 2005/0162356 | A1 | 7/2005 | Koyama et al. |

FOREIGN PATENT DOCUMENTS

| | | |
|---|---|---|
| EP | 0895219 | 2/1999 |
| EP | 0942407 | 9/1999 |
| EP | 1094436 | 4/2001 |
| JP | 03-205788 | 9/1991 |
| JP | 04-000772 | 1/1992 |
| JP | 04-349388 | 12/1992 |
| JP | 09-218664 | 8/1997 |
| JP | 2000-075836 | 3/2000 |
| JP | 2000-101136 | 4/2000 |
| KR | 2000-0075335 A | 12/2000 |
| KR | 2001-0018261 A | 3/2001 |
| KR | 2001-0057760 A | 7/2001 |

OTHER PUBLICATIONS

Vanslyke.S et al., "Organic Electroluminescent Devices With Improved Stability,", Appl. Phys. Lett. (Applied Physics Letters), Oct. 7, 1996, vol. 69, No. 15, pp. 2160-2162.

Stripe/on,, Merriam-Webster Online Dictionary http://www.m-w.com/cgi-bin/dictionary, Aug. 22, 2006, Merriam-Webster Online.

Search Report (Application No. 02025658.2; EP6085) Dated Jan. 29, 2007.

Office Action (Application No. 02152806.3; CN6085) Dated Dec. 22, 2006.

* cited by examiner light emitting direction

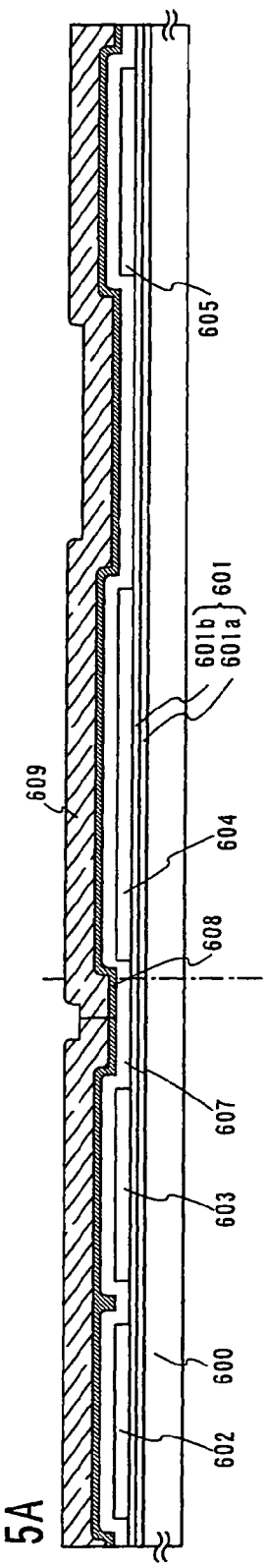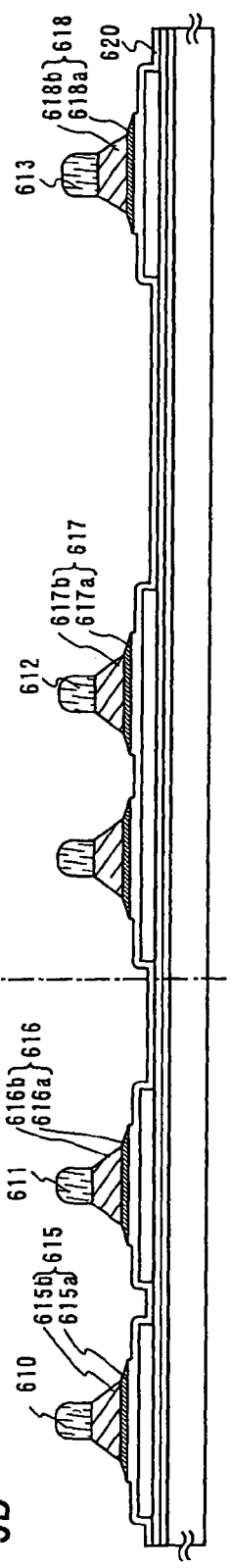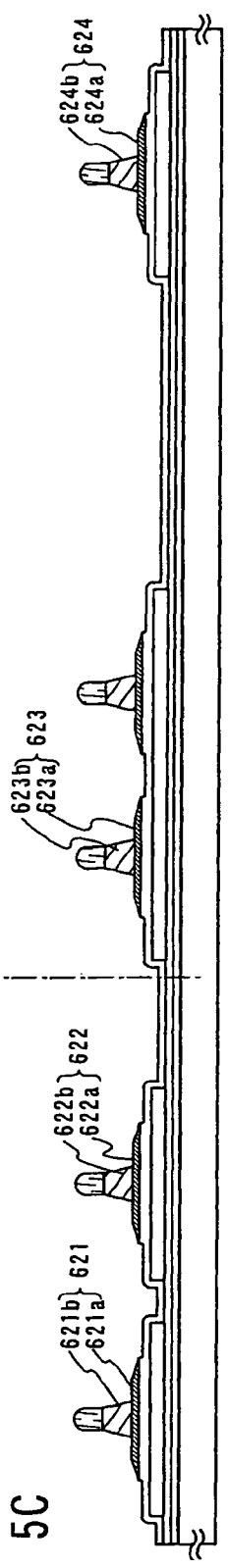

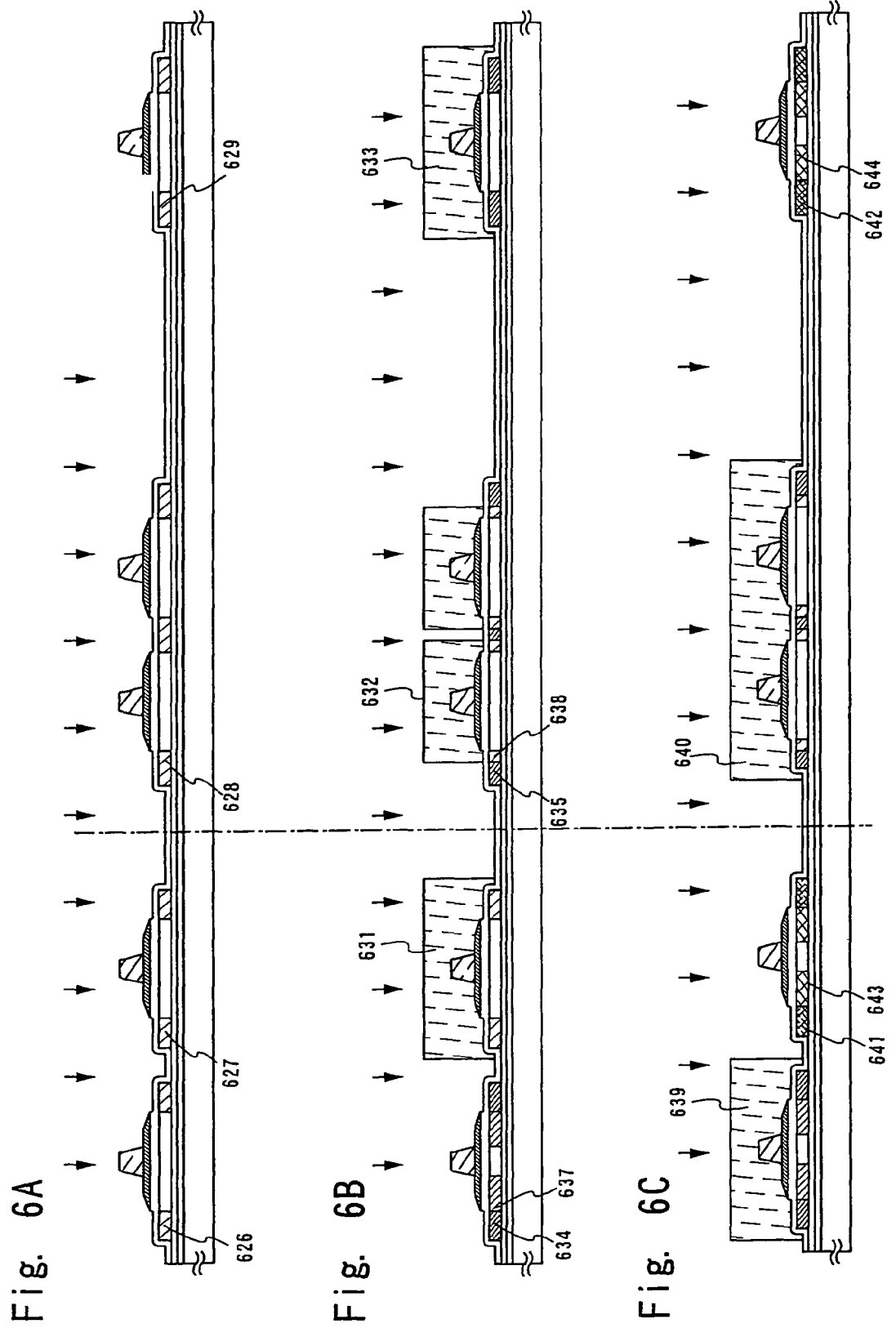

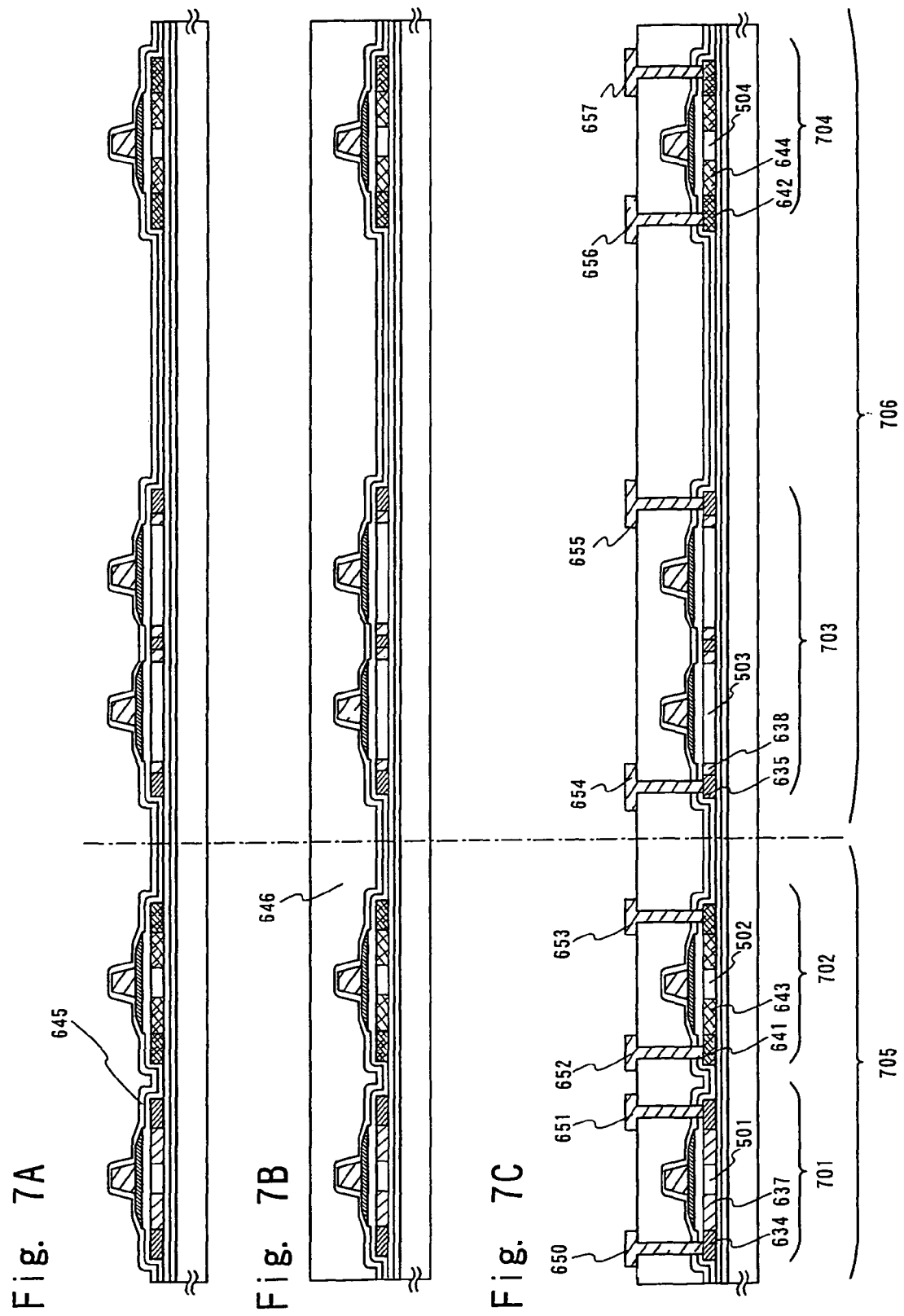

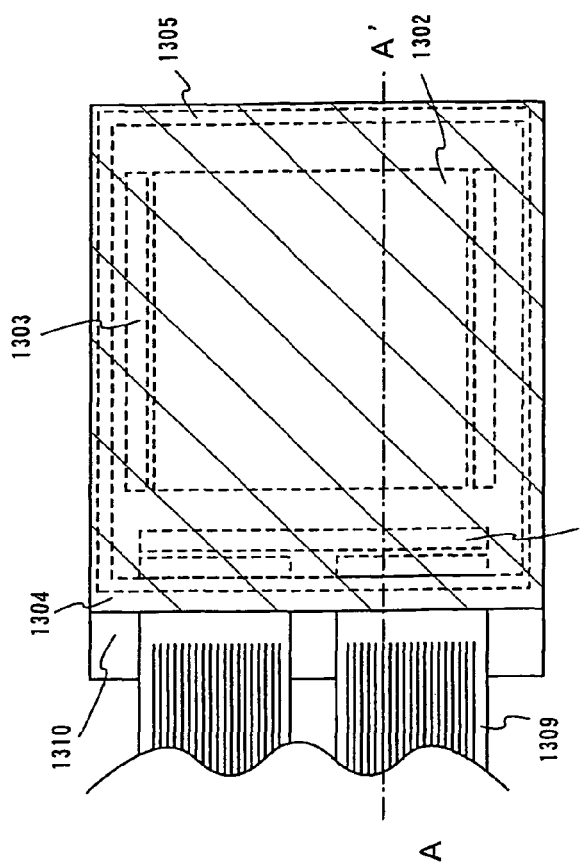
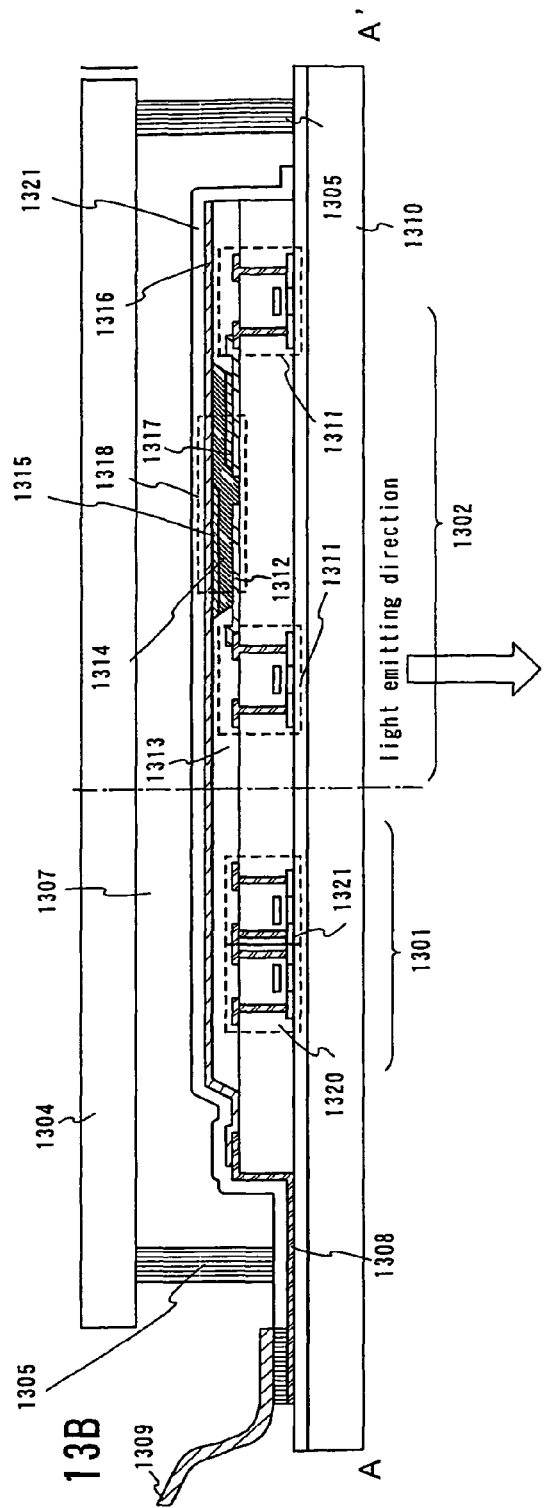
Fig. 13A
Fig. 13B

LIGHT EMITTING DEVICE

BACKGROUND OF THE INVENTION

1. Field of the Invention

The present invention relates to a light emitting device and a manufacturing method thereof using a light emitting element which has a film containing an organic compound (hereinafter referred to as an "organic compound layer") between a pair of electrodes and which can give fluorescence or luminescence by receiving an electric field. The light emitting device referred to in the present specification is an image display device, a light emitting device or a light source. Additionally, the following are included in examples of the light emitting device: a module wherein a connector, for example, a flexible printed circuit (FPC) or a tape automated bonding (TAB) tape, or a tape carrier package (TCP)) is set up onto a light emitting element; a module wherein a printed wiring board is set to the tip of a TAB tape or a TCP; and a module wherein integrated circuits (IC) are directly mounted on a light emitting element in a chip on glass (COG) manner.

2. Description of the Related Art

A light emitting element in the present invention is an element for emitting light by applying an electric field thereto. With respect to the light emitting mechanism, it is said that an electron injected from a cathode and a hole injected from an anode are recombined in an organic compound layer by applying a voltage to electrodes sandwiching an organic compound layer to produce a molecule with an excitation state (hereinafter referred to as "a molecular exciton") and the molecular exciton releases energy to emit light when it is returned to a ground state.

In such a light emitting element, the organic compound layer is generally made from a thin film having a thickness less than 1 μm. In addition, since the light emitting element is a self-luminous type element such that the organic compound layer itself emits light, a back light used in a conventional liquid crystal display is not required. Thus, it is the big advantage that an extremely thin and lightweight light emitting element can be manufactured.

Also, when the carrier mobility of, for example, an organic compound layer having a thickness of about 100 nm to 200 nm is considered, a period from the injection of a carrier to the recombination is about several ten nanoseconds. Even when a period required for a process from the recombination of a carrier to light emission is included in the period, light emission is conducted within the order of microsecond. Thus, an extremely high response speed is one of characteristics thereof.

Further, since the light emitting element is a carrier injection type light emitting element, it can be driven by a direct current voltage and a noise is hard to generate. With respect to a drive voltage, the organic compound layer is made from a uniform ultra thin film having a thickness of about 100 nm, an electrode material such that a carrier injection barrier to the organic compound layer is decreased is selected, and a hetero structure (two-layers structure) is introduced. Thus, a sufficient luminance of 100 cd/m$^2$ at 5.5 V has been achieved (Reference 1: C. W. Tang and S. A. VanSlyke, "Organic electroluminescent diodes" Applied Physics Letters, vol. 51, No. 12, pp. 913-915 (1987)).

From characteristics such as a thin type, lightweight, high speed responsibility, and direct-current low-voltage drive, the light emitting element has been noted as a next generation flat panel display element. In addition, since the light emitting element is a self-luminous type and has a wide viewing angle, the visibility is relatively good. Thus, it is considered that the light emitting element is effective as an element used for a display screen of an electronic apparatus.

There is a problem, however, with this type of light emitting element in that charge accumulates in an organic compound layer when using direct current drive, in which a unidirectional bias is always applied to the organic compound layer, thus reducing brightness.

It has been reported that reductions in brightness can be suppressed by inserting a hole injecting layer between an anode and a hole transporting layer, and in addition, by employing rectangular wave alternating current drive instead of the direct current drive (Reference 2: VanSlyke, S. A., Chen, C. H., and Tang, C. W., "Organic Electroluminescent Devices with Improved Stability", Appl. Phys. Lett., 69, (15) 2160-2162 (1996)).

This is because there is an energy barrier relaxation due to the insertion of the hole injecting layer, and voltages having different polarities are applied alternately. The accumulation of charge in an inside portion of the organic compound layer is therefore relieved, and there is experimental support that reductions in brightness can thus be suppressed. There is also a suggestion that alternating current drive is suitable for increasing the element lifetime of light emitting elements.

However, light emitting elements driven by alternating current drive normally have a laminate structure made from an anode, an organic compound layer, and a cathode, and therefore electric current flows and light emission is obtained only when a positive voltage (forward bias) is applied from the anode side and a negative voltage (reverse bias) is applied from the cathode side. That is, if alternating current drive is used, the light emitting element will not emit light when a reverse bias is applied.

A brightness thus becomes dark if the effective display time is short, and therefore a problem develops in that deterioration of the light emitting element advances if a high voltage is applied so as to maintain a predetermined brightness.

SUMMARY OF THE INVENTION

An object of the present invention is to provide a light emitting device using alternating current drive as a method of driving the light emitting device, and in which light emission is always obtained when voltages having different polarities are alternately applied. In addition, an object of the present invention is to provide a method of manufacturing the light emitting device.

A first light emitting element made from an anode, an organic compound layer, and a cathode, and a second light emitting element made from an anode, an organic compound layer, and a cathode are formed with the present invention. The light emitting elements are formed by the anodes and the cathodes sandwiching the same organic compound layer. The anode of the first light emitting element and the anode of the second light emitting element, and the cathode of the first light emitting element and the cathode of the second light emitting element, are formed on opposite sides of the organic compound layer, respectively, thus sandwiching the organic compound layer. One gray scale display is performed by any one of the first light emitting element and the second light emitting element.

Note that the light emitting element emits light by using alternating current drive with the light emitting device of the present invention, and that voltages having inverse polarities are applied alternately to the first light emitting element and the second light emitting element. The light emitting element to which a positive polarity voltage (forward bias) is applied emits light, and the other light emitting element, to which a negative polarity voltage (reverse bias) is applied, does not emit light. That is, light is emitted alternately in accordance with the voltage polarity applied to the two light emitting elements, and therefore light can always be emitted by the light emitting elements.

By using alternating current drive, the light emitting element of the present invention can relieve the accumulation of charge in the organic compound layer, and therefore drops in brightness can be suppressed, and the element lifetime can be increased. In addition, pixel light emitting elements can be made to always emit light with the light emitting device of the present invention, even when using alternating current drive, and therefore element deterioration due to direct current drive can be prevented, while gray scale display similar to that of direct current drive becomes possible.

According to a structure disclosed in the present invention, there is provided a light emitting device comprising: a first light emitting element; and a second light emitting element, the first light emitting element comprising: a first pixel electrode; an organic compound layer; and a first opposing electrode, and the second light emitting element comprising: a second pixel electrode; the organic compound layer; and a second opposing electrode, characterized in that: the first pixel electrode and the second opposing electrode are any one of anodes and cathodes; and the second pixel electrode and the first opposing electrode are the other of the anodes of the cathodes.

Further, according to another structure of the present invention, there is provided a light emitting device comprising: a first TFT formed on an insulating surface; a second TFT formed on the insulating surface; an interlayer insulating film formed on the first TFT and the second TFT; a first pixel electrode formed on the interlayer insulating film; a second pixel electrode formed on the interlayer insulating film; an insulating film formed covering a connection portion between the first pixel electrode and the first TFT, and a connection portion between the second pixel electrode and the second TFT; an organic compound layer formed on the first pixel electrode and the second pixel electrode; a first opposing electrode formed on the organic compound layer; and a second opposing electrode formed on the organic compound layer, characterized in that: the first pixel electrode and the second opposing electrode are any one of anodes and cathodes; and the second pixel electrode and the first opposing electrode are the other of the anodes and the cathodes.

Note that, according to each of the above-described structures, there is provided a light emitting device comprising: a first TFT formed on an insulating surface; a second TFT formed on the insulating surface; an interlayer insulating film formed on the first TFT and the second TFT; a first electrode; a first pixel electrode formed on the interlayer insulating film; a second electrode; a first auxiliary electrode; a second pixel electrode formed on the interlayer insulating film; an insulating film formed covering a connection portion between the first pixel electrode and the first TFT, and a connection portion between the second pixel electrode and the second TFT; an organic compound layer formed on the first pixel electrode and the second pixel electrode; a first opposing electrode formed on the organic compound layer; and a second opposing electrode formed on the organic compound layer, characterized in that: the first TFT and the second TFT each have a source region and a drain region; the first pixel electrode is made from the first electrode; the second pixel electrode is made from the second electrode and the first auxiliary electrode; the first electrode and the second electrode are electrically connected to one region, either the source region or the drain region, in an opening portion formed in the interlayer insulating film; the first pixel electrode and the second opposing electrode are any one of anodes and cathodes; and the second pixel electrode and the first opposing electrode are the other of the anodes and the cathodes.

Note that, according to each of the above-described structures, there is provided a light emitting device comprising: a first TFT formed on an insulating surface; a second TFT formed on the insulating surface; an interlayer insulating film formed on the first TFT and the second TFT; a first electrode; a first pixel electrode formed on the interlayer insulating film; a second electrode; a second pixel electrode formed on the interlayer insulating film; an insulating film formed covering a connection portion between the first pixel electrode and the first TFT, and a connection portion between the second pixel electrode and the second TFT; an organic compound layer formed on the first pixel electrode and the second pixel electrode; a first opposing electrode formed on the organic compound layer; and a second opposing electrode formed on the organic compound layer, characterized in that: the first TFT and the second TFT each have a source region and a drain region; the first pixel electrode is made from the first electrode; the second pixel electrode is made from the second electrode and the first auxiliary electrode; the first electrode and the second electrode are electrically connected to one region, either the source region or the drain region, in an opening portion formed in the interlayer insulating film; the first electrode and the second electrode are made from a material composing any one of an anode and a cathode; and the first auxiliary electrode is made from a material composing the other of the anode and the cathode.

Note that, according to each of the above-described structures, there is provided a light emitting device comprising: a first TFT formed on an insulating surface; a second TFT formed on the insulating surface; an interlayer insulating film formed on the first TFT and the second TFT; a first electrode; a first pixel electrode formed on the interlayer insulating film; a second electrode; a second pixel electrode formed on the interlayer insulating film; a second auxiliary electrode; a third electrode; an insulating film formed covering a connection portion between the first pixel electrode and the first TFT, and a connection portion between the second pixel electrode and the second TFT; an organic compound layer formed on the first pixel electrode and the second pixel electrode; a first opposing electrode formed on the organic compound layer; and a second opposing electrode formed on the organic compound layer, characterized in that: the first opposing electrode is made from the second auxiliary electrode and the third auxiliary electrode; the second opposing electrode is made from the third electrode; the first pixel electrode and the second opposing electrode are any one of anodes and cathodes; and the second pixel electrode and the first opposing electrode are the other of the anodes and the cathodes.

Note that, according to each of the above-described structures, there is provided a light emitting device comprising: a first TFT formed on an insulating surface; a second TFT formed on the insulating surface; an interlayer insulating film formed on the first TFT and the second TFT; a first electrode; a first pixel electrode formed on the interlayer insulating film; a second electrode; a second pixel electrode formed on the interlayer insulating film; a second auxiliary electrode; a third electrode; an insulating film formed covering a connection portion between the first pixel electrode and the first TFT, and a connection portion between the second pixel electrode and the second TFT; an organic compound layer formed on the first pixel electrode and the second pixel electrode; a first opposing electrode formed on the organic compound layer;

and a second opposing electrode formed on the organic compound layer, characterized in that: the first opposing electrode is made from the second auxiliary electrode and the third auxiliary electrode; the third electrode is made from a material composing any one of an anode and a cathode; and the second auxiliary electrode is made from a material composing the other of the anode and cathode.

Note that, in each of the above-described structures, the organic compound layer is characterized by being made from a bipolar material having hole transporting characteristics and electron transporting characteristics.

Note that, during manufacture of the light emitting device of the present invention, the first electrode and the second electrode are formed, and then the first auxiliary electrode is formed by evaporation on only the second electrode. The organic compound layers can then be formed on the electrodes from the same layers of the same materials.

Further, according to another structure of the present invention, there is provided a method of manufacturing a light emitting device, comprising: forming a first electrode and a second electrode on an insulating surface; forming a first auxiliary electrode on the second electrode; forming an organic compound layer on the first electrode, the second electrode, and the first auxiliary electrode; forming a second auxiliary electrode on the organic compound layer and in a position overlapping with the first electrode; and forming a third electrode on the organic compound layer and the second auxiliary electrode, characterized in that a first light emitting element and a second light emitting element are formed, the first light emitting element including: a first pixel electrode made from the first electrode; the organic compound layer; and a first opposing electrode made from the second auxiliary electrode and the third electrode, and the second light emitting element including: a second pixel electrode made from the second electrode and the first auxiliary electrode; the organic compound layer; and a second opposing electrode made from the third electrode.

Further, according to another structure of the present invention, there is provided a method of manufacturing a light emitting device, comprising: forming a first TFT and a second TFT on an insulating surface; forming an interlayer insulating layer on the first TFT and the second TFT; forming a first electrode and a second electrode on the interlayer insulating layer; forming a first auxiliary electrode on the second electrode; forming an insulating layer covering a connection portion between the first electrode and the first TFT and a connection portion between the second electrode and the second TFT; forming an organic compound layer on the first electrode, the second electrode, and the first auxiliary electrode; forming a second auxiliary electrode on the organic compound layer and in a position overlapping with the first electrode; and forming a third electrode on the organic compound layer and the second auxiliary electrode, characterized in that a first light emitting element and a second light emitting element are formed, the first light emitting element including: a first pixel electrode made from the first electrode; the organic compound layer; and a first opposing electrode made from the second auxiliary electrode and the third electrode, and the second light emitting element including: a second pixel electrode made from the second electrode and the first auxiliary electrode; the organic compound layer; and a second opposing electrode made from the third electrode.

Note that the above-described structure is characterized in that the first TFT and the second TFT each have a source region and a drain region; and the first electrode and the second electrode are electrically connected to any one of the source region and the drain region, in an opening portion formed in the interlayer insulating film.

Note that each of the above-described structures is characterized in that the first pixel electrode and the second opposing electrode are any one of anodes and cathodes; and the second pixel electrode and the first opposing electrode are the other of the anodes and the cathodes.

Note that the light emission obtained from the light emitting device of the present invention may contain light emission from any one of a singlet excitation state and a triplet excitation state, or from both of them.

BRIEF DESCRIPTION OF THE DRAWINGS

In the accompanying drawings:

FIGS. 5A to 5C are diagrams for explaining a process of manufacturing a light emitting device of the present invention;

FIGS. 6A to 6C are diagrams for explaining the process of manufacturing a light emitting device of the present invention;

FIGS. 7A to 7C are diagrams for explaining the process of manufacturing a light emitting device of the present invention;

FIGS. 13A and 13B are diagrams for explaining the external appearance of a light emitting device of the present invention;

DETAILED DESCRIPTION OF THE PREFERRED EMBODIMENTS

Embodiment Mode

Figure 1A:
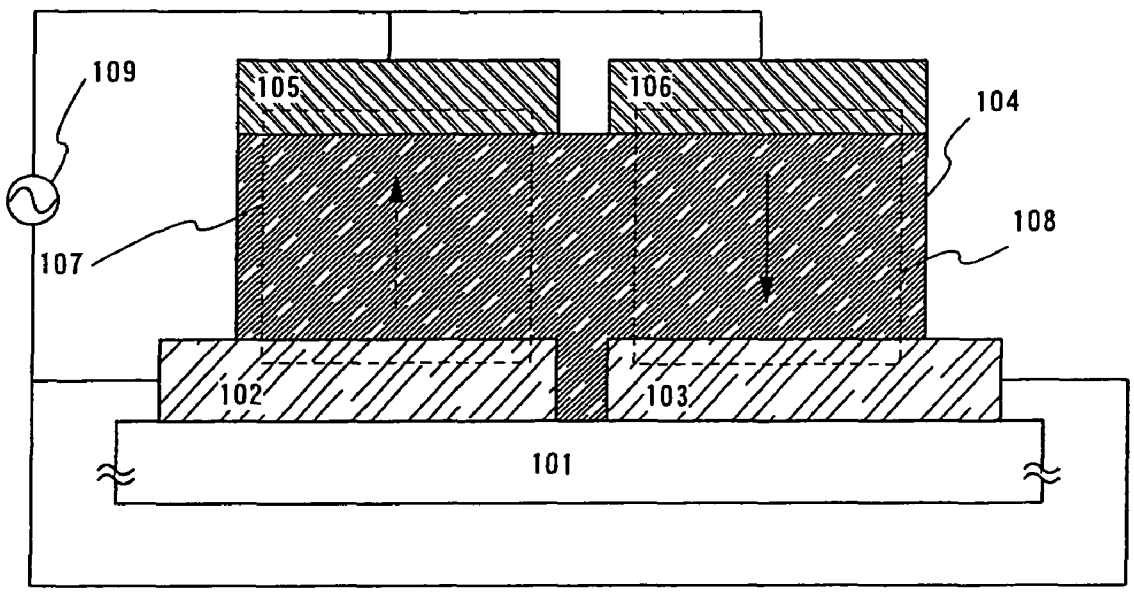
FIGS. 1A and 1B are diagrams for explaining the structure of an element of a light emitting device of the present invention.
Figure 1B:
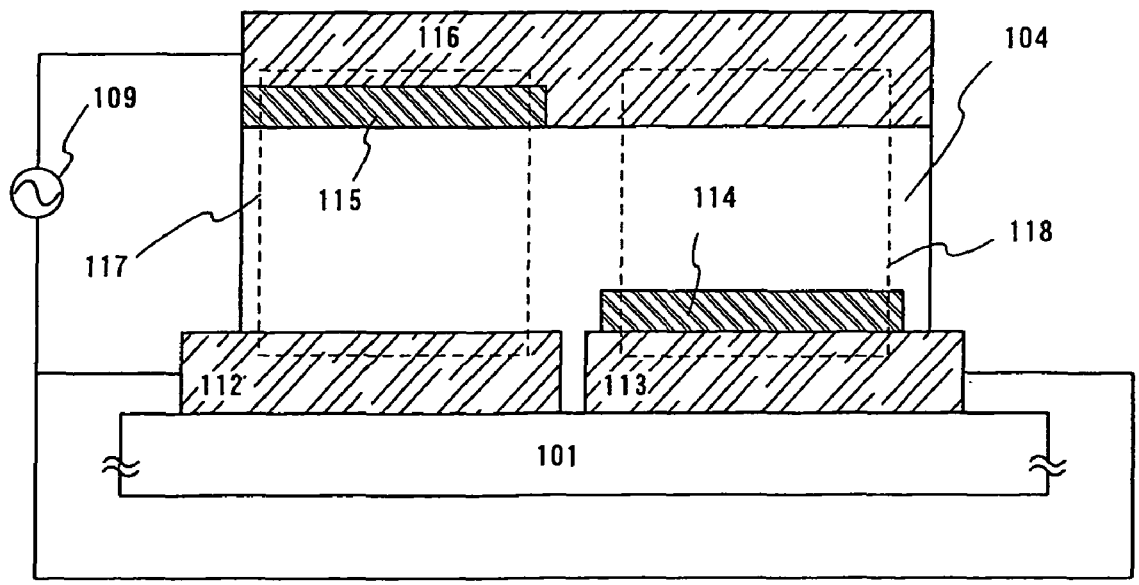

An embodiment mode of the present invention is explained using FIGS. 1A and 1B. Note that the element structure of light emitting elements of each pixel in the present invention is shown in FIG. 1A.

Two types of electrodes, an anode 102 and a cathode 103, are formed on a substrate 101 as shown in FIG. 1A. An organic compound layer 104 contacting the electrodes 102 and 103 is formed, and a cathode 105 and an anode 106 are formed contacting the organic compound layer 104. That is, there is adopted a structure in which the cathodes and the anodes are formed on both sides of the common organic compound layer 104, thus sandwiching the organic compound layer 104. In other words, a first light emitting element 107 having the anode 102, the organic compound layer 104, and the cathode 105, and a second light emitting element 108 having the cathode 103, the organic compound layer 104, and the anode 106 are formed.

Note that the electrodes formed before forming the organic compound layer are referred to as pixel electrodes within this specification. Specifically, the anode 102 and the cathode 103 are referred to as a pixel electrode (1) and a pixel electrode (2), respectively.

On the other hand, the electrodes formed after forming the organic compound layer are referred to as opposing electrodes. The cathode 105 and the anode 106 are specifically referred to as an opposing electrode (1) and an opposing electrode (2), respectively.

Note that electrons are injected from the cathode to the organic compound layer in the light emitting elements if a lower voltage is applied to the cathode than that applied to the anode, or a higher voltage is applied to the anode than that applied to the cathode, that is, a forward bias is applied. Holes are injected to the organic compound layer from the anode, and an electric current thus flows in the organic compound layer. Further, holes and electrons recombine in the organic compound layer 104, and luminescence is thus obtained.

Note that the organic compound layer 104 has bipolar characteristics in the present invention. Note also that the term bipolar characteristics refers to the transportation of both carrier electrons and holes.

Further, the two types of light emitting elements 107 and 108 in the present invention are connected to an alternating current electric power source 109. A forward bias is then applied alternately to one of the two types of light emitting elements 107 and 108, and a reverse bias is applied alternately to the other one of the light emitting elements 107 and 108.

Note that, within this specification, a state in which a forward bias is applied to a light emitting element and an electric current is flowing is referred to as the light emitting element functioning. That is, the light emitting element does not function when a reverse bias is applied to the light emitting element.

A specific method in the case of formation of a light emitting element of the present invention is explained in FIG. 1B.

A first electrode 112 and a second electrode 113 are formed on the substrate 101 by using a material having conductive characteristics. Note that a case in which the first electrode 112 and the second electrode 113 are formed by a material capable of becoming an anode is explained in this embodiment mode. A material having a high work function equal to or greater than 4.5 eV can be used as the conductive material employed here. Specifically, transparent conductive films such as ITO (indium tin oxide), IZO (indium zinc oxide), and $In_2O_3$—ZnO-based materials can be used as the conductive material, and in addition, long period elements residing in groups 3 to 11 of the periodic table, such as gold (Au), platinum (Pt), nickel (Ni), tungsten (W), and titanium (Ti) can also be used. Note that a transparent conductive material is used if an element structure is employed in which light is made to pass through the electrodes 112 and 113 formed here.

A first auxiliary electrode 114 is formed next on the second electrode 113 using a conductive material capable of becoming a cathode. Note that elements residing in group 1 or group 2 of the periodic table, namely alkaline metals, alkaline earth metals, and alloys and chemical compounds of these elements can be employed as materials having a small work function (specifically, a work function equal to or less than 3.8 eV) used in the first auxiliary electrode 114. In addition, transition metals including rare earth metals can also be used. The first auxiliary electrode 114 can be formed by evaporation or sputtering.

The organic compound layer 104 having bipolar characteristics is then formed on the first electrode 112 and the first auxiliary electrode 114. Note that low molecular weight materials and high molecular weight materials may be used as materials for forming the organic compound layer 104.

The organic compound layer 104 is formed by co-evaporation so that the weight ratio between an organic compound having hole transporting characteristics and an organic compound having electron transporting characteristics becomes 1:1 when using low molecular weight materials.

Specifically, the organic compound layer 114 can be formed by co-evaporating 4,4'-bis[N-(1-naphthyl)-N-phenyl-amino]-biphenyl (hereafter referred to as α-NPD), which has hole transporting characteristics, and tris(8-quinolinate) aluminum (hereafter referred to as $Alq_3$), which has electron transporting characteristics. Note that the light emitting region can also be limited by doping a material which becomes a dopant into a portion of the organic compound layer.

If high molecular weight materials are used, then the organic compound layer 104 can be formed by mixing an organic compound having hole transporting characteristics and an organic compound having electron transporting characteristics at a predetermined mole ratio within a solvent.

Specifically, the organic compound layer 104 can be formed by applying an application liquid formed by mixing polyvinyl carbazole (hereafter referred to as PVK), which has hole transporting characteristics, and the 1,3,4-oxadiazole derivative (2-(4-biphenyl)-5-(4-t-butylphenyl)-1,3,4-oxadiazole (hereafter referred to as PBD), which has electron transporting characteristics, in toluene. Note that the material which becomes a dopant may also be mixed into the application liquid.

A second auxiliary electrode 115 is formed next on the organic compound layer 104, in a position overlapping with the first electrode 112, using a conductive material that becomes a cathode. Note that the same materials as those used when forming the first auxiliary electrode 114 earlier may also be used as the conductive material employed here. However, the second auxiliary electrode 115 formed here is formed on the organic compound layer 104, and therefore it is desirable that it be formed by evaporation.

A third electrode 116 is formed lastly, covering the organic compound layer 104 and the second auxiliary electrode 115. Note that a conductive material capable of forming an anode is used as a material for forming the third electrode 116, and the same materials as those used when forming the first electrode 112 and the second electrode 113 earlier can also be employed here. However, the third electrode 116 formed here is formed on the organic compound layer 104, and therefore it is desirable that it be formed by evaporation.

A first light emitting element 117 composed of the first electrode 112, the organic compound layer 104, the second auxiliary electrode 115, and the third electrode and a second light emitting element 118 composed of the second electrode 113, the first auxiliary electrode 114, the organic compound layer 104, and the third electrode 116 can thus be formed.

Note that the first electrode 112 in the first light emitting element 117, made form a conductive material capable of becoming an anode, is the anode 102 in FIG. 1A, namely the pixel electrode (1). Conversely, it is possible for the second auxiliary electrode 115, made from a conductive material capable of becoming a cathode, to become the cathode from the standpoint of work function. However, the film resistance, which becomes a problem because an extremely thin film is formed, can be reduced by making a laminate with the third electrode 116, and therefore a structure in which the second auxiliary electrode 115 and the third electrode 116 are laminated is the cathode 105 of FIG. 1A, namely the opposing electrode (1).

Furthermore, the first auxiliary electrode 114 in the second light emitting element 118 is formed on the second electrode 113 from a conductive material capable of becoming a cathode can be a cathode from the standpoint of work function. However, film resistance, which becomes a problem because an extremely thin film is formed, can be reduced here by laminating the second electrode 113 and the first auxiliary electrode 114 together. The laminate is the cathode 103 in FIG. 1A, which is the opposing electrode (2). In contrast, the third electrode 116 made from a conductive material capable of becoming an anode is the anode 106 in FIG. 1A, which is the opposing electrode (2).

EMBODIMENTS

Embodiments of the present invention are explained below.

Embodiment 1

An active matrix structure in which TFTs (thin film transistors) and light emitting elements are electrically connected is explained in Embodiment 1. There is explained a case in which pixel electrodes of the light emitting elements are formed by transparent materials, and light developing in organic compound layers is extracted from the pixel electrodes (so-called bottom emission).

Figure 2A:
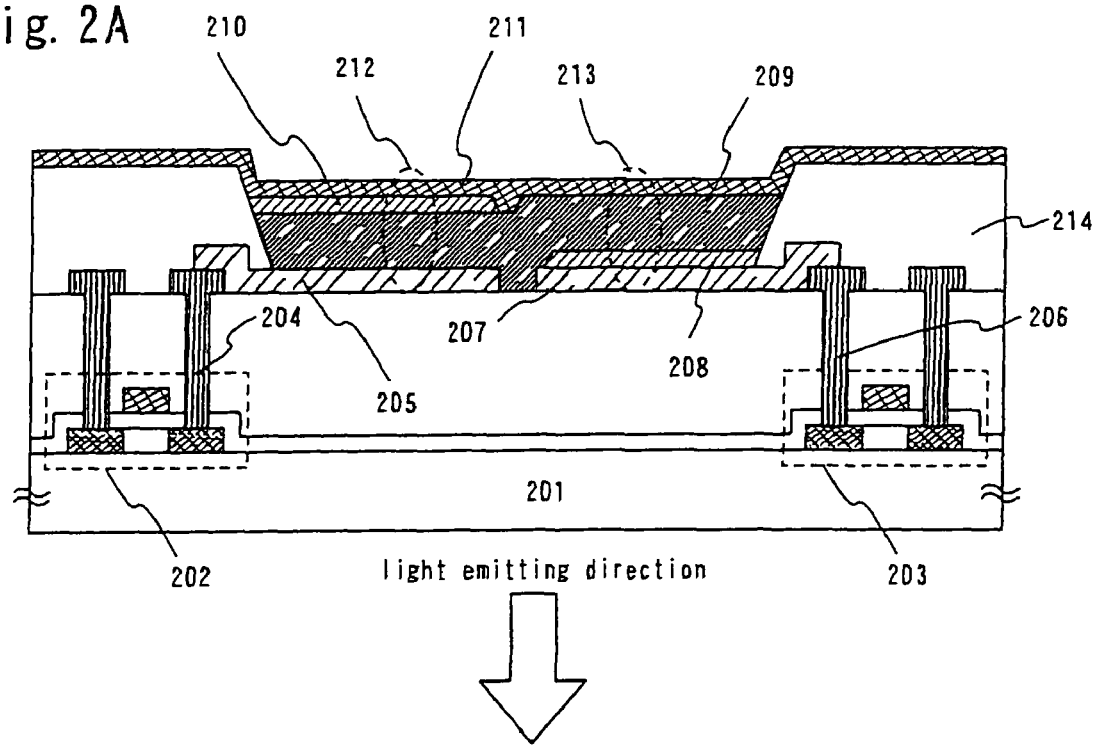
FIGS. 2A and 2B are diagrams for explaining the structure of an element of a light emitting device of the present invention.

A cross sectional diagram of a pixel forming a pixel portion of a light emitting device is shown in FIG. 2A. Two types of TFTs (electric current control TFT) are formed on a substrate 201, a first electrode 205 is electrically connected to a TFT (202) through a wiring 204, and a second electrode (2) 207 is electrically connected through a wiring 206. Note that the TFT1 (202) is formed by a p-channel TFT in Embodiment 1, and the TFT2 (203) is formed by an n-channel TFT.

Note that the wiring 204 and a connection portion of the first electrode 205, and the wiring 206 and a connection portion of the second electrode 207 are covered by an insulating layer 214 made from an insulating material. Note also that the insulating film is formed using a material containing silicon such as silicon oxide, silicon nitride, or silicon oxynitride, an organic resin film of a polyimide, a polyamide, an acrylic (including photosensitive acrylics), or BCB (benzocyclobutene), or by using an applied silicon oxide film (SOG, spin on glass) as a silicon oxide film. The film thickness can be set from 0.1 to 2 μm, and in particular, it is desirable to form the insulating layer 214 at a film thickness of 0.1 to 0.3 μm when using a material containing silicon such as silicon oxide, silicon nitride, or silicon oxynitride.

Opening portions are then formed in the insulating film at positions corresponding to the first electrode 205 and the second electrode 207 to form the insulating layer 214.

Specifically, a 1 μm insulating film is formed using photosensitive acrylic, and patterning is performed by photolithography. The insulating layer 214 is formed by then performing etching.

An organic compound layer 209, a second auxiliary electrode 210, and a third electrode 211 are laminated on the first electrode 205, and thus forming a first light emitting element 212. Further, a first auxiliary electrode 208, the organic compound layer 209, and the third electrode 211 are laminated on the second electrode 207, thus forming a second light emitting element 213.

Figure 2B:
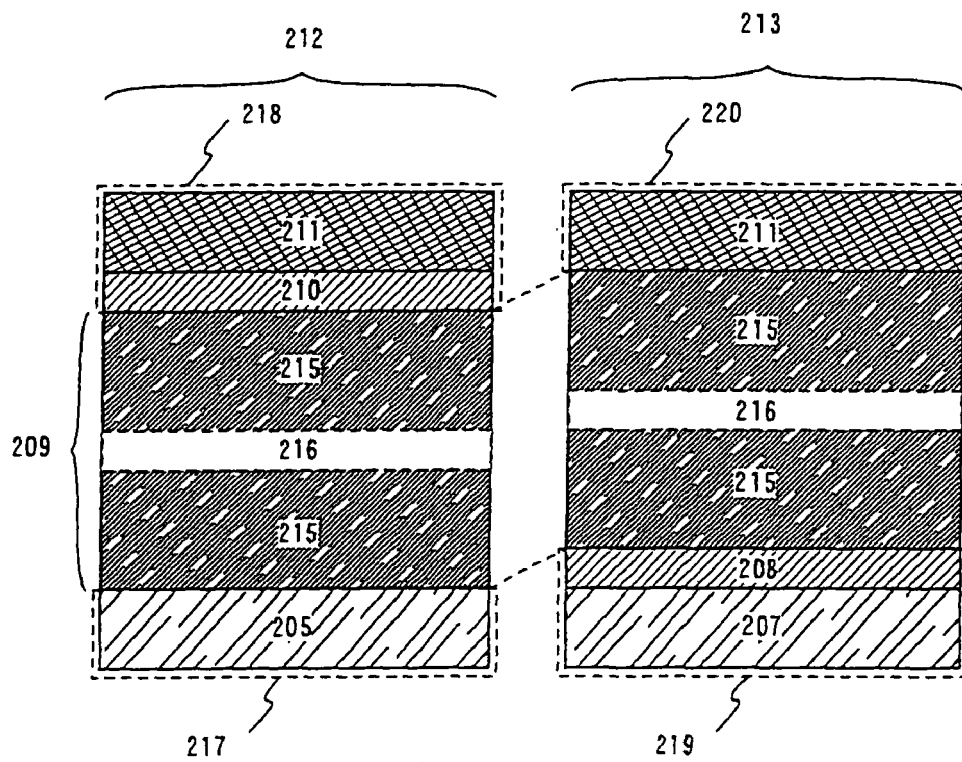

Note that the first electrode 205, the second electrode 207, and the third electrode 211 are formed by materials having a large work function and capable of becoming anodes, and that the first auxiliary electrode 208 and the second auxiliary electrode 210 are formed by materials having a small work function and capable of becoming cathodes. The first electrode 205 therefore becomes a first pixel electrode (anode) 217 in the first light emitting element 212, and a laminate of the second auxiliary electrode 210 and the third electrode 211 becomes a first opposing electrode (cathode) 218, as shown in FIG. 2B. Further, a laminate of the second electrode 207 and the first auxiliary electrode 208 in the second light emitting element 213 becomes a second pixel electrode (cathode) 219, and the third electrode 211 becomes a second opposing electrode (anode) 220, as shown in FIG. 2B.

The specific element structure of the first light emitting element 212 and the second light emitting element 213 is shown in FIG. 2B, and a method of manufacturing the light emitting elements is explained below.

However, steps up through formation of TFTs and wirings on a substrate are explained in detail by later embodiments, and therefore are omitted here. Manufacture of a light emitting element after wiring formation is explained in Embodiment 1.

The first electrode 205 is formed first, contacting the wiring 204, and the second electrode 207 is formed contacting the wiring 206. Note that the first electrode 205 and the second electrode 207 are transparent in Embodiment 1 because they become light emitting electrodes. Specifically, ITO, IZO, and $In_2O_3$—ZnO-based materials can be used. A 100 nm thick film of ITO is formed here by sputtering, after which patterning is performed, thus forming the electrodes.

In addition, the first auxiliary electrode 208 is formed on the second electrode 207. Note that, the first auxiliary electrode 208 is also formed using transparent material. Barium fluoride ($BaF_2$), calcium fluoride (CaF), cesium fluoride (CsF) and the like can be used as the first auxiliary electrode 208 material in Embodiment 1, and it is necessary to form the first auxiliary electrode 208 with a film thickness on the order of 1 nm. In addition, cesium (Cs), barium (Ba), calcium (Ca), magnesium alloys (Mg:Ag) and lanthanide materials can also be used. Note that the film may be formed having a thickness equal to or less than 20 nm in this case. A 1 nm thick film of barium fluoride ($BaF_2$) is formed here, and then forming the first auxiliary electrode 208. Further, the first auxiliary electrode 208 can be formed only on the second electrode 207 by performing evaporation using a metal mask.

The organic compound layer 209 is formed next. The organic compound layer can be formed in Embodiment 1 by co-evaporation of a 1:1 ratio by weight of a hole transporting organic compound and an electron transporting organic compound. Further, the film thickness of the organic compound layer 209 is 100 nm in Embodiment 1.

Specifically, the organic compound layer 209 can be formed by co-evaporating 4,4'-bis[N-(1-naphthyl)-N-phenyl-amino]-biphenyl (hereafter referred to as α-NPD), which has hole transporting characteristics, and tris(8-quinolinate) aluminum (hereafter referred to as $Alq_3$), which has electron transporting characteristics, so as to achieve a 1:1 ratio by weight. The layer formed here is referred to as a bipolar layer 215.

In addition, a doped region 216 which becomes a light emitting region can be formed in Embodiment 1 by doping 4-dicyanomethylene-2-methyl-6-(joulolidine-4-il-vinyl)-4H-pyran (hereinafter referred to as DCM2) as a dopant during formation of the bipolar layer 215. Note that co-evaporation can be performed so that the ratio by weight in the doped area 216 becomes ($\alpha$-NPD):($Alq_3$):(DCM)=50:50:1 at this point.

The light emitting region can then be limited to the organic compound layer 209 by again forming the bipolar layer 215 on the doped region 216. Note that an organic compound layer that shows red color luminescence can be formed when forming the organic compound layer 209 by using these types of materials.

The bipolar layer 215 may be formed by similar materials ($\alpha$-NPD and $Alq_3$), and dimethyl quinacridon can be doped into the doped region 216 when forming an organic compound layer that shows green color luminescence. Note that co-evaporation can be performed so that the ratio by weight in the doped area 216 becomes ($\alpha$-NPD):($Alq_3$):(quinacridon)=50:50:1 at this point.

In addition, when forming an organic compound layer that shows blue color luminescence, the bipolar layer 215 can be formed by co-evaporating vasocupronin (hereinafter referred to as BCP) and 4,4',4"-tris[N-(3-methylphenyl)-N-phenylamino]-triphenylamine (hereinafter referred to as MTDATA) so as that the ratio by weight becomes 1:1. Thus, formation can be performed by doping perylene on the doped region 216. Note that co-evaporation can be performed so that the ratio by weight in the doped area 216 becomes (BCP):(MTDATA):(perylene)=50:50:5 at this point, thus performing the formation.

Note that the doped region 216 is formed at a film thickness of 20 to 30 nm.

Pixels having the organic compound layer showing red color luminescence, the organic compound layer showing green color luminescence, and the organic compound layer 209 showing blue color luminescence are formed in the pixel portion, and full color display becomes possible.

Further, although the doped region 216 becomes the light emitting region for the organic compound layer 209 shown by Embodiment 1, a light emitting layer made from a completely different material can also be formed between the bipolar layers 215 without forming the doped layer 216. In this case, the materials stated above may be used as materials for forming the bipolar layers 215, and 4,4'-bis(2,2-diphenyl-vinyl)-biphenyl (hereinafter referred to as DPVBi) and the like can be given as examples of materials used for forming the light emitting layer.

On the other hand, in the case where high molecular weight materials are used, PVK and PBD may be mixed within toluene at a mole ratio of 1:0.3, and a dopant tris(2-phenyl pyridine) indium (hereinafter referred to as $Ir(ppy)_3$) may be combined with the PVK and PBD mixture such that $Ir(ppy)_3$ has a mole ratio of 3 mole % versus the total number of moles of PVK and PBD, thus forming an application liquid. The layer is then formed by application.

In addition, the second auxiliary electrode 210 is formed on the organic compound layer 209. Note that the second auxiliary electrode 210 can be formed by using the same material as that of the first auxiliary electrode 208. Here, barium (Ba) is deposited to have a thickness of 20 nm to thereby form the second auxiliary electrode 210. Further, the second auxiliary electrode 210 can be formed only on the first electrode 205 by performing evaporation using a metal mask.

The third electrode 211 is formed lastly. Note that materials having a high work function equal to or greater than 4.5 eV are used as conductive materials for forming the third electrode 211. Further, it is desirable to employ a structure in which light is not emitted from the third electrode 211 in Embodiment 1 in order to avoid reducing the light emission efficiency of the light emitting element, and therefore the third electrode 211 is formed using a material having light shielding characteristics. Specifically, long period elements residing in groups 3 to 11 of the periodic table such as gold (Au), platinum (Pt), nickel (Ni), tungsten (W), and titanium (Ti) can be used. Note that gold (Au) is formed at a film thickness of 100 nm in Embodiment 1, thus forming the third electrode 211.

The first light emitting element 212 and the second light emitting element 213 are included inside one pixel, and a bottom emission light emitting device in which light can be emitted from the pixel electrode side, can be formed in both of the light emitting elements.

Embodiment 2

A structure in which light developing in an organic compound layer is extracted from an opposing electrode (so-called top emission), and in which the opposing electrode is formed by a material having transparency, differently from Embodiment 1, is explained in Embodiment 2.

Figure 3A:
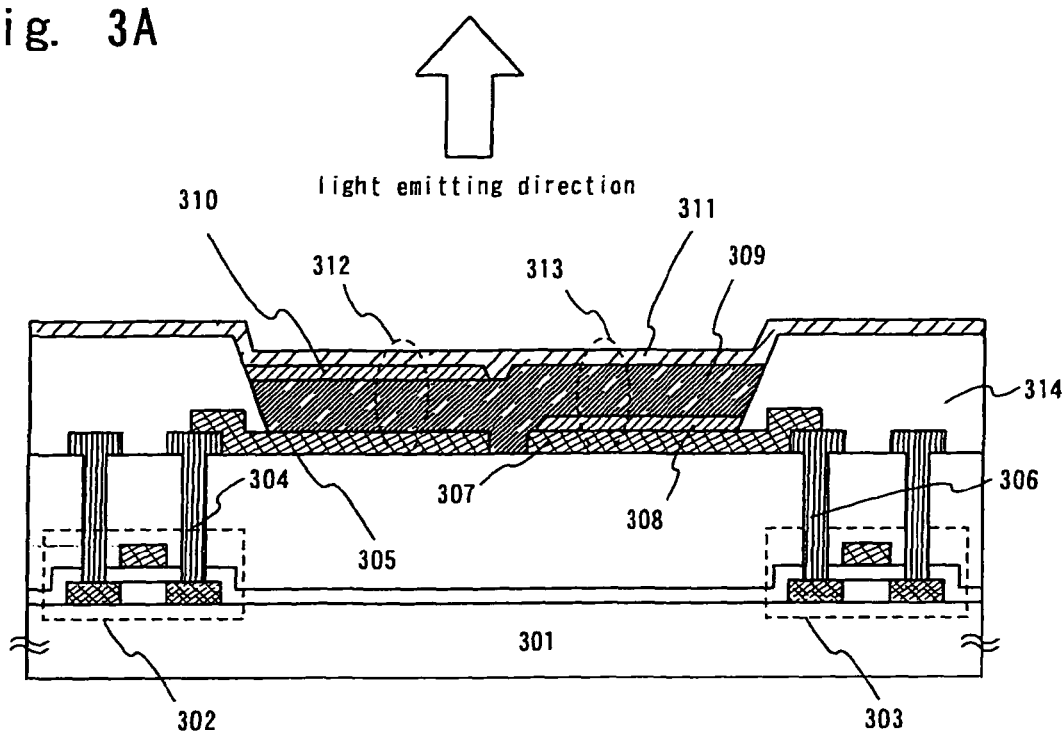
FIGS. 3A and 3B are diagrams for explaining the structure of an element of a light emitting device of the present invention.

A cross sectional diagram of a pixel forming a pixel portion of a light emitting device is shown in FIG. 3A. Two types of TFTs (electric current control TFTs) are formed on a substrate 301, a first electrode 305 is electrically connected to a TFT1 (302) through a wiring 304, and a second electrode (2) 307 is electrically connected through a wiring 306. Note that the TFT1 (302) is formed by a p-channel TFT, and the TFT2 (303) is formed by an n-channel TFT in Embodiment 2.

Note that the wiring 304 and a connection portion of the first electrode 305, and the wiring 306 and a connection portion of the second electrode 307 are covered by an insulating layer 314 made from an insulating material as in Embodiment 1. Note also that the insulating layer 314 may be formed by using the same materials shown in Embodiment 1. Further, similarly, opening portions are then formed in the insulating film at positions corresponding to the first electrode 305 and the second electrode 307 to form the insulating layer 314.

An organic compound layer 309, a second auxiliary electrode 310, and a third electrode 311 are laminated on the first electrode 305, and thus forming a first light emitting element 312. Further, a first auxiliary electrode 308, the organic compound layer 309, and the third electrode 311 are laminated on the second electrode 307, thus forming a second light emitting element 313.

Figure 3B:
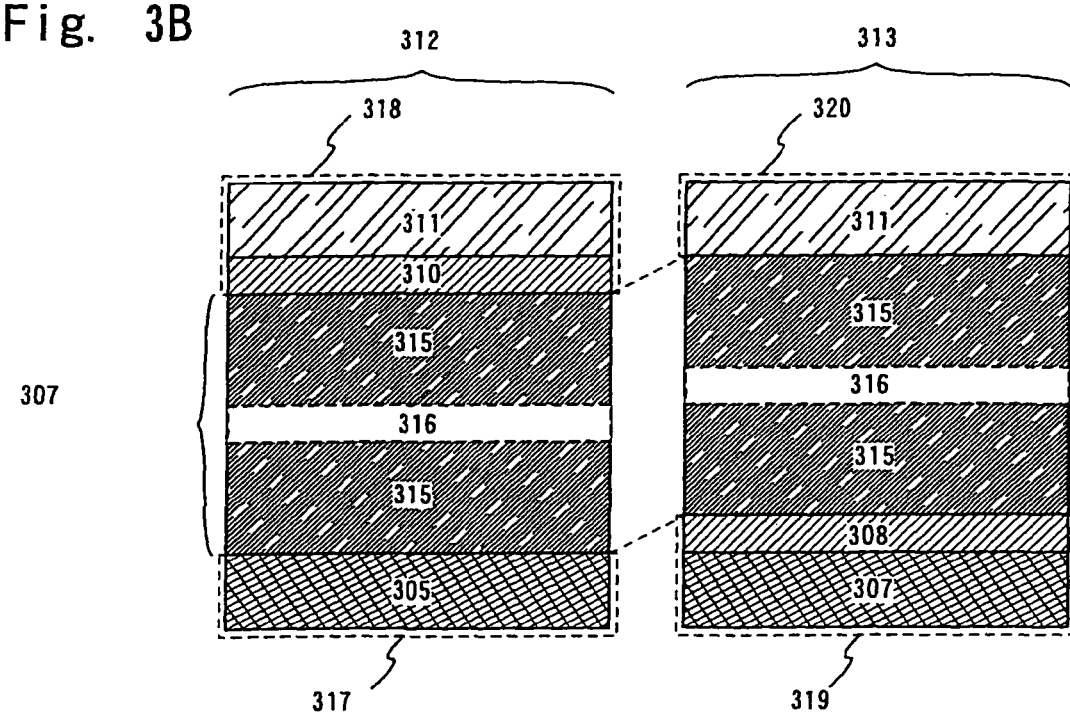

Note that the first electrode 305, the second electrode 307, and the third electrode 311 are formed by materials having a large work function and capable of becoming anodes, and that the first auxiliary electrode 308 and the second auxiliary electrode 310 are formed by materials having a small work function and capable of becoming cathodes. The first electrode 305 therefore becomes a first pixel electrode (anode) 317 in the first light emitting element 312, and a laminate of the second auxiliary electrode 310 and the third electrode 311 becomes a first opposing electrode (cathode) 318, as shown in FIG. 3B. Further, a laminate of the second electrode 307 and the first auxiliary electrode 308 in the second light emitting element 313 becomes a second pixel electrode (cathode) 319, and the third electrode 311 becomes a second opposing electrode (anode) 320, as shown in FIG. 3B.

The specific element structure of the first light emitting element 312 and the second light emitting element 313 is shown in FIG. 3B, and a method of manufacturing the light emitting elements is explained below.

However, steps up through formation of TFTs and wirings on a substrate are explained in detail by later embodiments, and therefore are omitted here. Manufacture of a light emitting element after wiring formation is explained in Embodiment 2.

The first electrode 305 is formed first, contacting the wiring 304, and the second electrode 307 is formed contacting the wiring 306. Note that the first electrode 305 and the second electrode 307 have light shielding property in Embodiment 2 because it is desirable that the light should not be emitted from the first electrode 305 and the second electrode 307 in order to avoid reducing the light emitting efficiency of the light emitting elements. Specifically, materials having a work function equal to or greater than 4.5 eV are used. A 100 nm thick film of titanium nitride (TiN) is formed here by sputtering, after which patterning is performed, thus forming the electrodes.

In addition, the first auxiliary electrode 308 is formed on the second electrode 307. Barium fluoride ($BaF_2$), calcium fluoride (CaF), cesium fluoride (CsF) and the like can be used as the first auxiliary electrode 308 material in Embodiment 2, and it is necessary to form the first auxiliary electrode 308 with a film thickness on the order of 1 nm. In addition, cesium (Cs), barium (Ba), calcium (Ca), magnesium alloys (Mg:Ag) and lanthanide materials can also be used. Note that the film may be formed having a thickness equal to or less than 20 nm in this case. Here, magnesium alloy (Mg:Ag) is deposited to have a thickness of 20 nm to thereby form the first auxiliary element 308. Further, the first auxiliary electrode 308 can be formed only on the second electrode 307 by performing evaporation using a metal mask.

The organic compound layer 309 is formed next. The organic compound layer can be formed in Embodiment 2 in the same manner as that of Embodiment 1 by co-evaporation of a 1:1 ratio by weight of a hole transporting organic compound and an electron transporting organic compound. Further, the film thickness of the organic compound layer 309 is 100 nm in Embodiment 2.

Specifically, the organic compound layer 309 can be formed by co-evaporating 4,4'-bis[N-(1-naphthyl)-N-phenyl-amino]-biphenyl (hereafter referred to as α-NPD), which has hole transporting characteristics, and tris(8-quinolinate) aluminum (hereafter referred to as $Alq_3$), which has electron transporting characteristics, so as to achieve a 1:1 ratio by weight. The layer formed here is referred to as a bipolar layer 315.

In addition, a doped region 316 which becomes a light emitting region can be formed in Embodiment 2 by doping 4-dicyanomethylene-2-methyl-6-(julolidine-4-il-vinyl)-4H-pyran (hereinafter referred to as DCM2) as a dopant during formation of the bipolar layer 315. Note that co-evaporation can be performed so that the ratio by weight in the doped area 316 becomes (α-NPD):($Alq_3$):(DCM)=50:50:1 at this point.

The light emitting region can then be limited to the organic compound layer 309 by again forming the bipolar layer 315 on the doped region 316. Note that an organic compound layer that shows red color luminescence can be formed when forming the organic compound layer 309 by using these types of materials.

The bipolar layer 315 may be formed by similar materials (α-NPD and $Alq_3$), and dimethyl quinacridon can be doped into the doped region 316 when forming an organic compound layer that shows green color luminescence. Note that co-evaporation can be performed so that the ratio by weight in the doped area 316 becomes (α-NPD):($Alq_3$):(quinacridon)=50:50:1 at this point.

In addition, when forming an organic compound layer that shows blue color luminescence, the bipolar layer 315 can be formed by co-evaporating vasocupronin (hereinafter referred to as BCP) and 4,4',4''-tris[N-(3-methylphenyl)-N-phenylamino]-triphenylamine (hereinafter referred to as MTDATA) so that the ratio by weight becomes 1:1. Then, formation can be performed by doping perylene on the doped region 316 can be formed by doping perylene. Note that co-evaporation can be performed so that the ratio by weight in the doped area 316 becomes (BCP):(MTDATA):(perylene)=50:50:5 at this point, thus performing the formation.

Note that the doped region 316 is formed at a film thickness of 20 to 30 nm.

Pixels having the organic compound layer showing red color luminescence, the organic compound layer showing green color luminescence, and the organic compound layer 309 showing blue color luminescence are formed in the pixel portion, and full color display becomes possible.

Further, although the doped region 316 becomes the light emitting region for the organic compound layer 309 shown by Embodiment 2, a light emitting layer made from a completely different material can also be formed between the bipolar layers 315 without forming the doped layer 316. In this case, the materials stated above may be used as materials for forming the bipolar layers 315, and 4,4'-bis(2,2-diphenyl-vinyl)-biphenyl (hereinafter referred to as DPVBi) and the like can be given as examples of materials used for forming the light emitting layer.

On the other hand, in the case where high molecular weight materials are used, PVK and PBD may be mixed within toluene at a mole ratio of 1:0.3, and a dopant tris(2-phenyl pyridine) indium (hereinafter referred to as Ir(ppy)$_3$) may be combined with the PVK and PBD mixture such that Ir(ppy)$_3$ has a mole ratio of 3 mol % versus the total number of moles of PVK and PBD, thus forming an application liquid. The layer is then formed by application.

In addition, the second auxiliary electrode 310 is formed on the organic compound layer 309. Note that the second auxiliary electrode 310 can be formed by using the same material as that of the first auxiliary electrode 308. Here, barium fluoride ($BaF_2$) is deposited to have a thickness of 1 nm to thereby form the second auxiliary electrode 310. Further, the second auxiliary electrode 310 can be formed only on the first electrode 305 by performing evaporation using a metal mask.

The third electrode 311 is formed lastly. Note that materials having a high work function equal to or greater than 4.5 eV are used as conductive materials for forming the third electrode 311. Note that the third electrode 311 is transparent in Embodiment 2 because it becomes light emitting electrodes. Specifically, materials having work function equal to or greater than 4.5 eV are used. A 100 nm thick film of ITO is formed here by evaporation or sputtering, thus forming the third electrode 311.

The first light emitting element 312 and the second light emitting element 313 are included inside one pixel, and a top emission light emitting device in which light can be emitted from the pixel electrode side, can be formed in both of the light emitting elements.

Embodiment 3

A case of a top emission light emitting device which is the same as the top emission light emitting device shown in Embodiment 2 and has an element structure different therefrom is explained in Embodiment 3.

Figure 4A:
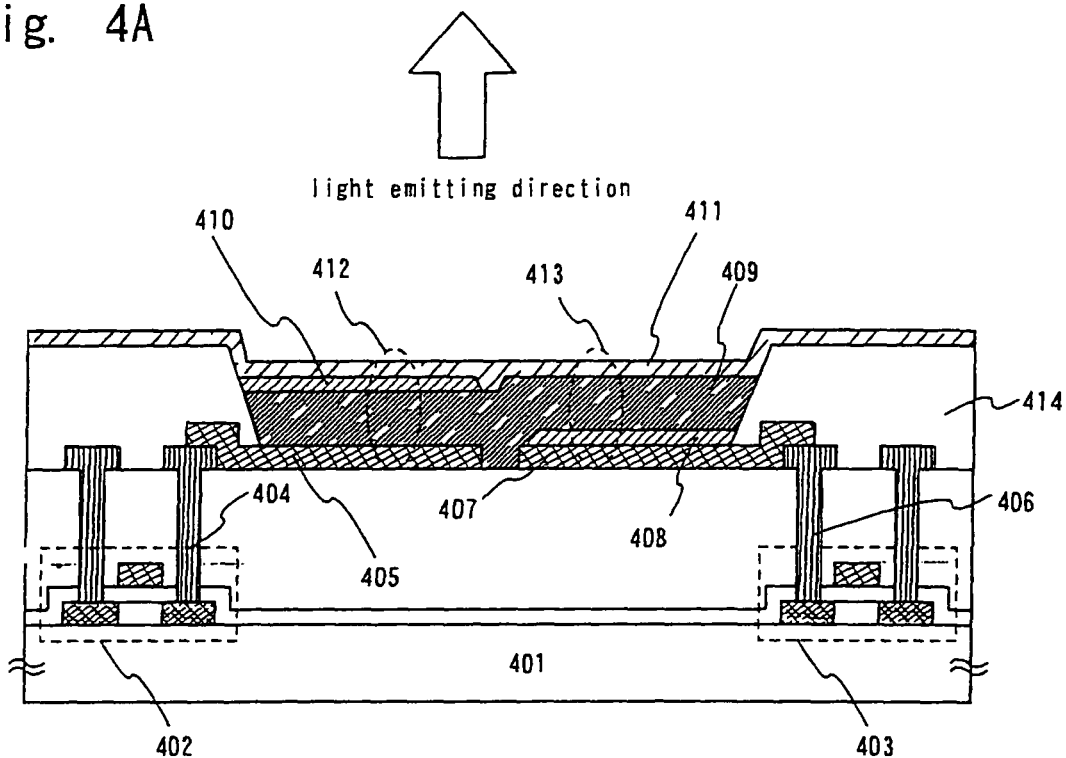
FIGS. 4A and 4B are diagrams for explaining the structure of an element of a light emitting device of the present invention.

A cross sectional diagram of a pixel forming a pixel portion of a light emitting device is shown in FIG. 4A. Two types of TFTs (electric current control TFTs) are formed on a substrate 401, a first electrode 405 is electrically connected to a TFT1 (402) through a wiring 404, and a second electrode (2) 407 is electrically connected through a wiring 406. Note that the TFT1 (402) is formed by an n-channel TFT, and the TFT2 (403) is formed by a p-channel TFT in Embodiment 1.

Note that the wiring 404 and a connection portion of the first electrode 405, and the wiring 406 and a connection portion of the second electrode 407 are covered by an insulating layer 414 made from an insulating material as in Embodiment 1. Note also that the insulating layer 414 may be formed by using the same materials shown in Embodiment 1. Further, similarly, opening portions are then formed in the insulating film at positions corresponding to the first electrode 405 and the second electrode 407 to form the insulating layer 414.

An organic compound layer 409, a second auxiliary electrode 410, and a third electrode 411 are laminated on the first electrode 405, and thus forming a first light emitting element 412. Further, a first auxiliary electrode 408, the organic compound layer 409, and the third electrode 411 are laminated on the second electrode 407, thus forming a second light emitting element 413.

Figure 4B:
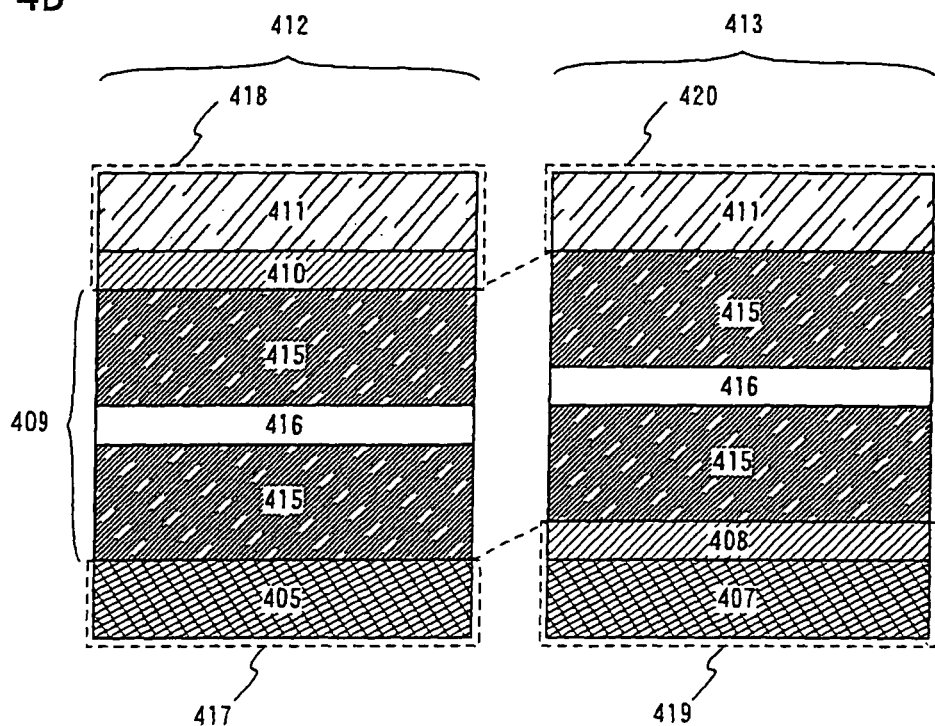

Note that the first electrode 405, the second electrode 407, and the third electrode 411 are formed by materials having a small work function and capable of becoming cathodes, and that the first auxiliary electrode 408 and the second auxiliary electrode 410 are formed by materials having a large work function and capable of becoming anodes. The first electrode 405 therefore becomes a first pixel electrode (cathode) 417 in the first light emitting element 412, and a laminate of the second auxiliary electrode 410 and the third electrode 411 becomes a first opposing electrode (anode) 418, as shown in FIG. 4B. Further, a laminate of the second electrode 407 and the first auxiliary electrode 408 in the second light emitting element 413 becomes a second pixel electrode (anode) 419, and the third electrode 411 becomes a second opposing electrode (cathode) 420, as shown in FIG. 4B.

The specific element structure of the first light emitting element 412 and the second light emitting element 413 is shown in FIG. 4B, and a method of manufacturing the light emitting elements is explained below.

However, steps up through formation of TFTs and wirings on a substrate are explained in detail by later embodiments, and therefore are omitted here. Manufacture of a light emitting element after wiring formation is explained in Embodiment 3.

The first electrode 405 is formed first, contacting the wiring 404, and the second electrode 407 is formed contacting the wiring 406. Note that the first electrode 405 and the second electrode 407 have light shielding property in Embodiment 3 because it is desirable that the light should not be emitted from the first electrode 405 and the second electrode 407 in order to avoid reducing the light emitting efficiency of the light emitting elements. Specifically, materials having a work function equal to or lower than 3.8 eV are used. A 100 nm thick film of magnesium alloy (Mg:Ag) is formed here by sputtering, after which patterning is performed, thus forming the electrodes.

In addition, the first auxiliary electrode 408 is formed on the second electrode 407. Note that long period elements residing in group 3 to 11 of the periodic table, such as gold (Au), platinum (Pt), nickel (Ni), tungsten (W), and titanium (Ti) can be used as the conductive material for the first auxiliary electrode 408 material in this embodiment. Here, gold (Au) is deposited to have a thickness of 20 nm to thereby form the first auxiliary electrode 408. Further, the first auxiliary electrode 408 can be formed only on the second electrode 407 by performing evaporation using a metal mask.

The organic compound layer 409 is formed next. Further, the film thickness of the organic compound layer 409 is 100 nm in Embodiment 3.

First, the bipolar layer 415 can be formed by co-evaporating 4,4'-bis[N-(1-naphthyl)-N-phenyl-amino]-biphenyl (hereafter referred to as α-NPD), which has hole transporting characteristics, and tris(8-quinolinate) aluminum (hereafter referred to as $Alq_3$), which has electron transporting characteristics, so as to achieve a 1:1 ratio by weight.

A light emitting layer 416 that becomes a light emitting region is formed during formation of the bipolar layer 415 in Embodiment 3. Note that 4,4'-bis(2,2-diphenyl-vinyl)-biphenyl (hereinafter referred to as DPVBi) is used as a material for forming the light emitting element 416 in Embodiment 3. Further, the light emitting layer 416 is formed at a film thickness of 20 to 30 nm.

The light emitting region can then be limited to the organic compound layer 409 by again forming the bipolar layer 415 on the light emitting layer 416.

Note that although a case of forming the light emitting layer 416 in the organic compound layer is shown in Embodiment 3, a structure in which a doped region like that shown by Embodiment 1 or Embodiment 2 is formed may also be used. Further, it is also possible to form the light emitting element 416 by using high molecular weight materials, and not using all low molecular weight materials.

In addition, the second auxiliary electrode 410 is formed on the organic compound layer 409. Note that the second auxiliary electrode 410 can be formed by using the same material as that of the first auxiliary electrode 408. Here, barium fluoride ($BaF_2$) is deposited to have a thickness of 1 nm to thereby form the second auxiliary electrode 410. Further, the second auxiliary electrode 410 can be formed only on the first electrode 405 by performing evaporation using a metal mask.

The third electrode 411 is formed lastly. Note that materials having a low work function equal to or less than 3.8 eV are used as conductive materials for forming the third electrode 411. Note also that the third electrode 411 becomes a light emitting electrode in Embodiment 3, and therefore has light transmitting characteristics. A material having a work function equal to or less than 3.8 eV is used in the formation. Specifically, elements residing in group 1 or group 2 of the periodic table, namely alkaline metals, alkaline earth metals, and alloys and chemical compounds containing these elements can be used. In addition, transition metals including rare earth metals can also be used. Cesium (Cs) and silver (Ag) are formed and laminated by evaporation or sputtering here, at a film thickness of 20 nm, thus forming the third electrode 411.

The first light emitting element 412 and the second light emitting element 413 are included inside one pixel, and a top emission light emitting device in which light can be emitted from the opposing electrode side, can be formed in both of the light emitting elements.

Embodiment 4

Embodiment of the present invention will be described with references to FIG. 5 to 7. Here, a detailed description will be given on a method of manufacturing a pixel portion and TFTs (n-channel TFTs and p-channel TFTs) of a driving circuit that are provided in the periphery of the pixel portion are formed on the same substrate at the same time.

The base insulating film 601 is formed on the substrate 600 to obtain the first semiconductor film having a crystal structure. Subsequently, isolated in island-shape semiconductor layer 602 to 605 is formed by conducting etching treatment to the desired shape.

As a substrate 600, the glass substrate (#1737) is used. As a base insulating film 601, a silicon oxynitride film 601a is formed on the silicon oxide film by plasma CVD at a temperature of 400° C. using $SiH_4$, $NH_3$, and $N_2O$ as material gas (the composition ratio of the silicon oxynitride film: Si=32%, O=27%, N=24%, H=17%). The silicon oxynitride film has a thickness of 50 nm (preferably 10 to 200 nm). The surface of the film is washed with ozone water and then an oxide film on the surface is removed by diluted fluoric acid (diluted down to 1/100). Next, a silicon oxynitride film 601b is formed by plasma CVD at a temperature of 400° C. using $SiH_4$ and $N_2O$ as material gas (the composition ratio of the silicon oxynitride film: Si=32%, O=59%, N=7%, H=2%). The silicon oxynitride film 601b has a thickness of 100 nm (preferably 50 to 200 nm). Without exposing the laminate to the air, a semiconductor film having an amorphous structure (here, an amorphous silicon film) is formed on the laminate by plasma CVD at a temperature of 300° C. using $SiH_4$ as material gas. The semiconductor film is 54 nm (preferably 25 to 80 nm) in thickness.

A base film 601 in this example has a two-layer structure. However, the base insulating film may be a single layer or more than two layers of insulating films. The material of the semiconductor film is not limited but it is preferable to form the semiconductor film from silicon or a silicon germanium alloy ($Si_xGe_{1-x}$ (X=0.0001 to 0.02)) by a known method (sputtering, LPCVD, plasma CVD, or the like). Plasma CVD apparatus used may be one that processes wafer by wafer or one that processes in batch. The base insulating film and the semiconductor film may be formed in succession in the same chamber to avoid contact with the air.

Next, a nickel acetate solution containing 10 ppm of nickel by weight is applied by a spinner. Instead of application, nickel may be sprayed onto the entire surface by sputtering.

The semiconductor film is subjected to heat treatment to crystallize it and obtain a semiconductor film having a crystal structure. The heat treatment is achieved in an electric furnace or by irradiation of intense light. When heat treatment in an electric furnace is employed, the temperature is set to 500 to 650° C. and the treatment lasts for 4 to 24 hours. Here, a silicon film having a crystal structure is obtained by heat treatment for crystallization (at 550° C. for 4 hours) after heat treatment for dehydrogenation (at 500° C. for an hour). Although the semiconductor film is crystallized here by heat treatment using an electric furnace, it may be crystallized by a lamp annealing apparatus capable of achieving crystallization in a short time. This example employs a crystallization technique in which nickel is used as a metal element for accelerating crystallization of silicon. However, other known crystallization techniques, solid phase growth and laser crystallization, for example, may be employed.

An oxide film on the surface of the silicon film having a crystal structure is removed by diluted fluoric acid or the like. Then in order to enhance the crystallization rate and repair defects remaining in crystal grains, the silicon film is irradiated with laser light (XeCl, the wavelength: 308 nm) in the air or in an oxygen atmosphere. The laser light may be excimer laser light having a wavelength of 400 nm or less, or the second harmonic or third harmonic of a YAG laser. Pulse laser light having a repetition frequency of 10 to 1000 Hz is employed. The laser light is collected by an optical system to have an energy density of 100 to 500 $mJ/cm^2$ and scans the silicon film surface at an overlapping ratio of 90 to 95%. Here, the film is irradiated with laser light at a repetition frequency of 30 Hz and an energy density of 393 $mJ/cm^2$ in the air. Since the film is irradiated in the air or in an oxygen atmosphere, an oxide film is formed on the surface because of the laser light irradiation.

After removing an oxide film formed during irradiating the laser light by using hydrofluoric acid, the second laser light may be irradiated in a nitrogen atmosphere or vacuum atmosphere to smooth the surface of the semiconductor film. Excimer laser light with a wavelength equal to or less than 400 nm, or the second or the third harmonic of a YAG laser, is used for the laser light (the second laser light). The energy density of the second laser light is made larger than the energy density of the first laser light, preferably from 30 to 60 $mJ/cm^2$ larger.

Laser light irradiation at this point is very important because it is used to form an oxide film to prevent doping of the silicon film having a crystal structure with a rare gas element in later film formation by sputtering and because it enhances the gettering effect. The oxide film formed by this laser light irradiation and an oxide film formed by treating the surface with ozone water for 120 seconds together make a barrier layer that has a thickness of 1 to 5 nm in total.

Next, an amorphous silicon film containing argon is formed on the barrier layer by sputtering to serve as a gettering site. The thickness of the amorphous silicon film is 50 nm here. The conditions for forming the amorphous silicon film here include setting the film formation pressure to 0.3 Pa, the gas (Ar) flow rate to 50 sccm, the film formation power to 3 kW, and the substrate temperature to 150° C. The atomic concentration of argon contained in the amorphous silicon film formed under the above conditions is $3 \times 10^{20}$ to $6 \times 10^{20}$ atoms/$cm^3$ and the atomic concentration of oxygen thereof is $1 \times 10^{19}$ to $3 \times 10^{19}$ atoms/$cm^3$. Thereafter, heat treatment is conducted in a lamp annealing apparatus at 750° C. for 3 minutes for gettering.

Using the barrier layer as an etching stopper, the gettering site, namely, the amorphous silicon film containing argon, is selectively removed. Then, the barrier layer is selectively removed by diluted fluoric acid. Nickel tends to move toward a region having high oxygen concentration during gettering, and therefore it is desirable to remove the barrier layer that is an oxide film after gettering.

Also, after forming a semiconductor layer, in order to control the threshold (Vth) of the TFTs, the semiconductor layers may be doped with an impurity element that gives the p-type or n-type conductivity. Impurity elements known to give a semiconductor the p type conductivity are Group 13 elements in the periodic table, such as boron (B), aluminum (Al), and gallium (Ga). Impurity elements known to give a semiconductor the n type conductivity are Group 15 elements in the periodic table, such as phosphorus (P) and arsenic (As).

Next, a thin oxide film is formed from ozone water on the surface of the obtained silicon film having a crystal structure (also called a polysilicon film). A resist mask is formed for etching to obtain semiconductor layers 602 to 605 having desired shapes and separated from one another like islands. After the semiconductor layers are obtained, the resist mask is removed.

The oxide film is removed by an etchant containing fluoric acid, and at the same time, the surface of the silicon film is washed. Then, an insulating film mainly containing silicon is formed to serve as a gate insulating film 607. The gate insulating film here is a silicon oxynitride film (composition ratio: Si=32%, O=59%, N=7%, H=2%) formed by plasma CVD to have a thickness of 115 nm.

As shown in FIG. 5A, a first conductive film 608 with a thickness of 20 to 100 nm and a second conductive film 609 with a thickness of 100 to 400 nm are layered on the gate insulating film 607. In this example, a 30 nm thick tantalum nitride film and a 370 nm thick tungsten film are layered on the gate insulating film 607 in the order stated.

The conductive materials of the first conductive film and second conductive film are elements selected from the group consisting of Ta, W, Ti, Mo, Al, and Cu, or alloys or compounds mainly containing the above elements. The first conductive film and the second conductive film may be semiconductor films, typically polycrystalline silicon films, doped with phosphorus or other impurity elements or may be Ag—Pd—Cu alloy films. The present invention is not limited to a two-layer structure conductive film. For example, a three-layer structure consisting of a 30 nm thick tungsten film, 500 nm thick aluminum-silicon alloy (Al—Si) film, and 50 nm thick titanium nitride film layered in this order may be employed. When the three-layer structure is employed, tungsten of the first conductive film may be replaced by tungsten nitride, the aluminum-silicon alloy (Al—Si) film of the second conductive film may be replaced by an aluminum-titanium alloy (Al—Ti) film, and the titanium nitride film of the third conductive film may be replaced by a titanium film. Alternatively, a single-layer conductive film may be used.

As shown in FIG. 5B, resist masks 610 to 613 are formed by light exposure to conduct the first etching treatment for forming gate electrodes and wiring lines. The first etching treatment is conducted under first and second etching conditions. ICP (inductively coupled plasma) etching is employed. The films can be etched into desired taper shapes by using ICP etching and adjusting etching conditions (the amount of power applied to a coiled electrode, the amount of power applied to a substrate side electrode, the temperature of the substrate side electrode, etc.) suitably. Examples of the etching gas used include chlorine-based gas, typically, $Cl_2$, $BCl_3$, $SiCl_4$, or $CCl_4$, fluorine-based gas, typically, $CF_4$, $SF_6$, or $NF_3$, and $O_2$.

The substrate side (sample stage) also receives an RF power of 150 W (13.56 MHz) to apply a substantially negative self-bias voltage. The area (size) of the substrate side electrode is 12.5 cm×12.5 cm and the coiled electrode is a disc 25 cm in diameter (here, a quartz disc on which the coil is provided). The W film is etched under these first etching conditions to taper it around the edges. Under the first etching conditions, the rate of etching the W film is 200.39 nm/min. and the rate of etching the TaN film is 80.32 nm/min. The selective ratio of W to TaN is therefore about 2.5. The W film is tapered under the first etching conditions at an angle of about 26°. Thereafter, the first etching conditions are switched to the second etching conditions without removing the resist masks 610 to 613. The second etching conditions include using $CF_4$ and $Cl_2$ as etching gas, setting the gas flow rate ratio thereof to 30:30 (sccm), and giving an RF (13.56 MHz) power of 500 W to a coiled electrode at a pressure of 1 Pa to generate plasma for etching for about 30 seconds. The substrate side (sample stage) also receives an RF power of 20 W (13.56 MHz) to apply a substantially negative self-bias voltage. Under the second etching conditions including the use of a mixture of $CF_4$ and $Cl_2$, the TaN film and the W film are etched to about the same degree. The rate of etching the W film is 58.97 nm/min. and the rate of etching the TaN film is 66.43 nm/min. under the second etching conditions. In order to etch the films without leaving any residue on the gate insulating film, the etching time is prolonged by approximately 10 to 20%.

In the first etching treatment, first conductive layers and second conductive layers are tapered around the edges by forming the resist masks into proper shapes and by the effect of the bias voltage applied to the substrate side. The angle of the tapered portions may be 15 to 45°.

The first shape conductive layers 615 to 618 (the first conductive layers 615a to 618a and the second conductive layers 615b to 618b) are formed that is consisted of the first conductive layer and the second conductive layer by the first etching treatment. The insulating film 607 to be a gate insulating film is etched 10 to 20 nm, to form a gate insulating film 620 having a region becoming thin where the first shape conductive layers 615 to 618 do not overlap.

Next, a second etching process is conducted without removing the masks made of resist. Here, $SF_6$, $Cl_2$ and $O_2$ are used as etching gases, the flow rate of the gases is set to 24/12/24 sccm, and RF (13.56 MHz) power of 700 W is applied to a coil-shape electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching process, an etching rate to W is 227.3 mm/min, an etching rate to TaN is 32.1 nm/min, a selection ratio of W to TaN is 7.1, an etching rate to SiON that is the insulating film 620 is 33.7 nm/min, and a selection ratio of W to SiON is 6.83. In the case where $SF_6$ is used as the etching gas, the selection ratio with respect to the insulating film 620 is high as described above. Thus, reduction in the film thickness can be suppressed. In this embodiment, the film thickness of the insulating film 620 is reduced by only about 8 nm.

By the second etching process, the taper angle of W becomes 70°. By the second etching process, second conductive layers 621b to 624b are formed. On the other hand, the first conductive layers are hardly etched to become first conductive layers 621a to 624a. Note that the first conductive layers 621a to 624a have substantially the same size as the first conductive layers 615a to 618a. In actuality, the width of the first conductive layer may be reduced by approximately 0.3 μm, namely, approximately 0.6 μm in the total line width in comparison with before the second etching process. However, there is almost no change in size of the first conductive layer.

Further, in the case where, instead of the two-layer structure, the three-layer structure is adopted in which a 30 nm thick tungsten film, an alloy film of aluminum and silicon (Al—Si) with a thickness of 500 nm, and a 50 nm thick titanium nitride film are sequentially laminated, under the first etching conditions of the first etching process in which: $BCl_3$, $Cl_2$ and $O_2$ are used as material gases; the flow rate of the gases is set to 65/10/5 (sccm); RF (13.56 MHz) power of 300 W is applied to the substrate side (sample stage); and RF (13.56 MHz) power of 450 W is applied to a coil-shape electrode with a pressure of 1.2 Pa to generate plasma, etching is performed for 117 seconds. As to the second etching conditions of the first etching process, $CF_4$, $Cl_2$ and $O_2$ are used, the flow rate of the gases is set to 25/25/10 sccm, RF (13.56 MHz) power of 20 W is also applied to the substrate side (sample stage); and RF (13.56 MHz) power of 500 W is applied to a coil-shape electrode with a pressure of 1 Pa to generate plasma. With the above conditions, it is sufficient that etching is performed for about 30 seconds. In the second etching process, $BCl_3$ and $Cl_2$ are used, the flow rate of the gases are set to 20/60 sccm, RF (13.56 MHz) power of 100 W is applied to the substrate side (sample stage), and RF (13.56 MHz) power of 600 W is applied to a coil-shape electrode with a pressure of 1.2 Pa to generate plasma, thereby performing etching.

Next, the masks made of resist are removed, and then, a first doping process is conducted to obtain the state of FIG. 6A. The doping process may be conducted by ion doping or ion implantation. Ion doping is conducted with the conditions of a dosage of $1.5 \times 10^{14}$ atoms/cm$^2$ and an accelerating voltage of 60 to 100 kV. As an impurity element imparting n-type conductivity; phosphorous (P) or arsenic (As) is typically used. In this case, first conductive layers and second conductive layers 621 to 624 become masks against the impurity element imparting n-type conductivity, and first impurity regions 626 to 629 are formed in a self-aligning manner. The impurity element imparting n-type conductivity is added to the first impurity regions 626 to 629 in a concentration range of $1 \times 10^{16}$ to $1 \times 10^{17}$ atoms/cm$^3$. Here, the region having the same concentration range as the first impurity region is also called an n$^-$ region.

Note that although the first doping process is performed after the removal of the masks made of resist in this embodiment, the first doping process may be performed without removing the masks made of resist.

Subsequently, as shown in FIG. 6B, masks 631 to 633 made of resist are formed, and a second doping process is conducted. The mask 631 is a mask for protecting a channel forming region and a periphery thereof of a semiconductor layer forming a p-channel TFT of a driver circuit, the mask 632 is a mask for protecting a channel forming region and LDD (Light Doped Drain) region of a semiconductor layer forming a TFT of a pixel portion.

With the ion doping conditions in the second doping process: a dosage of $1.5 \times 10^{15}$ atoms/cm$^2$; and an accelerating voltage of 60 to 100 kV, phosphorous (P) is doped. Here, impurity regions are formed in the respective semiconductor layers in a self-aligning manner with the second conductive layer 621b as a mask. Of course, phosphorous is not added to the regions covered by the masks 631 to 633. Thus, second impurity regions 634 and 635 and a third impurity region 637 are formed. The impurity element imparting n-type conductivity is added to the second impurity regions 634 and 635 in a concentration range of $1 \times 10^{20}$ to $1 \times 10^{21}$ atoms/cm$^3$. Here, the region having the same concentration range as the second impurity region is also called an n$^+$ region.

Further, the third impurity region is formed at a lower concentration than that in the second impurity region by the first conductive layer, and added with the impurity element imparting n-type conductivity in a concentration range of $1 \times 10^{18}$ to $1 \times 10^{19}$ atoms/cm$^3$. Note that since doping is conducted by passing the portion of the first conductive layer having a tapered shape, the third impurity region has a concentration gradient in which an impurity concentration increases toward the end portion of the tapered portion. Here, the region having the same concentration range as the third impurity region is called an n$^-$ region. Furthermore, the regions covered by the mask 632 are not added with the impurity element in the second doping process, and become first impurity region 638.

Next, after the masks 631 to 633 made of resist are removed, masks 639 and 640 made of resist are newly formed, and a third doping process is conducted as shown in FIG. 6C.

In the driver circuit, by the third doping process as described above, fourth impurity regions 641 and 642 and fifth impurity regions 643 and 644 are formed in which an impurity element imparting p-type conductivity is added to the semiconductor layer forming the p-channel TFT and to the semiconductor layer forming the storage capacitor.

Further, the impurity element imparting p-type conductivity is added to the fourth impurity regions 641 and 642 in a concentration range of $1 \times 10^{20}$ to $1 \times 10^{21}$ atoms/cm$^3$. Note that, in the fourth impurity regions 641 and 642, phosphorous (P) has been added in the preceding step (n$^-$ region), but the impurity element imparting p-type conductivity is added at a concentration that is 10 to 100 times as high as that of phosphorous. Thus, the fourth impurity regions 641 and 642 have a p-type conductivity. Here, the region having the same concentration range as the fourth impurity region is also called a p$^+$ region.

Further, fifth impurity regions 643 and 644 are formed in regions overlapping the tapered portion of the second conductive layer 125a, and are added with the impurity element imparting p-type conductivity in a concentration range of $1 \times 10^{18}$ to $1 \times 10^{20}$ atoms/cm$^3$. Here, the region having the same concentration range as the fifth impurity region is also called a p$^-$ region.

Through the above-described steps, the impurity regions having n-type or p-type conductivity are formed in the respective semiconductor layers. The conductive layers 621 to 624 become gate electrodes of TFTs.

Next, an insulating film (not shown) that covers substantially the entire surface is formed. In this embodiment, a 50 nm thick silicon oxide film is formed by plasma CVD. Of course, the insulating film is not limited to a silicon oxide film, and other insulating films containing silicon may be used in a single layer or a lamination structure.

Then, a step of activating the impurity element added to the respective semiconductor layers is conducted. In this activation step, a rapid thermal annealing (RTA) method using a lamp light source, a method of irradiating light emitted from a YAG laser or excimer laser from the back surface, heat treatment using a furnace, or a combination thereof is employed.

Further, although an example in which the insulating film is formed before the activation is shown in this example, a step of forming the insulating film may be conducted after the activation is conducted.

Next, a first interlayer insulating film 645 is formed of a silicon nitride film, and heat treatment (300 to 550° C. for 1 to 12 hours) is performed, thereby conducting a step of hydrogenating the semiconductor layers. (FIG. 7A) The first interlayer insulating film 645 may be a lamination structure consisting of the silicon nitride oxide film and the silicon nitride film. This step is a step of terminating dangling bonds of the semiconductor layers by hydrogen contained in the first interlayer insulating film 645. The semiconductor layers can be hydrogenated irrespective of the existence of an insulating film (not shown) formed of a silicon oxide film. Incidentally, it is important to apply the heating process condition that the conductive layer can withstand in the step of hydrogenation. As another means for hydrogenation, plasma hydrogenation (using hydrogen excited by plasma) may be conducted.

Next, a second interlayer insulating film 646 is formed from an organic insulating material on the first interlayer insulating film 645. In this embodiment, an acrylic resin film with a thickness of 1.6 μm is formed. Then, contact holes that reach each impurity region are formed. In this embodiment, a plurality of etching processes is sequentially performed. In this embodiment, the second interlayer insulting film is etched with the first interlayer insulating film as the etching stopper, the first interlayer insulating film is etched with the insulating film (not shown) as the etching stopper, and then, the insulating film (not shown) is etched.

Thereafter, wirings are formed by using Al, Ti, Mo, W and the like. In some cases, the pixel electrode of light emitting element that is formed in contact with the wirings can be formed at the same time. As the material of the electrodes and pixel electrode, it is desirable to use a material excellent in reflecting property, such as a film containing Al or Ag as its main constituent or a lamination film of the above film. Thus, wirings 650 to 657 are formed.

As described above, a driver circuit 705 having an n-channel TFT 701 and a p-channel TFT 702, and pixel portion 706 having a switching TFT 703 made from an n-channel TFT and a current control TFT 704 made from an p-channel TFT can be formed on the same substrate. (FIG. 7C) In this specification, the above substrate is called an active matrix substrate for the sake of convenience.

In the pixel portion 706, the switching TFT 703 (n-channel TFT) has a channel forming region 503, the first impurity region (n⁻ region) 638 formed outside the conductive layer 623 forming the gate electrode, and the second impurity region (n⁺ region) 635 functioning as a source or drain region.

In the pixel portion 706, the TFT for current control 704 (n-channel TFT) has a channel forming region 504, the fourth impurity region (n⁻ region) 644 that is formed on the out side of conductive layer 624 forming the gate electrode and source region, and the fifth impurity region (n⁺ region) 642 functioning as a source or drain region. Note that, the TFT 704 is connected to the electrodes of light emitting element through the wiring 656 that is connected to the fifth impurity region (n⁺ region) 642 in this embodiment. Since the current control TFT 704 is made of p-channel TFT the anode of light emitting element is preferably formed in this embodiment.

Further, in the driver circuit 705, the n-channel TFT 701 has a channel forming region 501, the third impurity region (n⁻ region) 637 that overlaps a part of the conductive layer 621 forming the gate electrode through the insulating film, and the second impurity region (n⁺ region) 634 functioning as a source region or a drain region.

Further, in the driver circuit 705, the p-channel TFT 702 has a channel forming region 502, the fifth impurity region (p⁻ region) 643 that overlaps a part of the conductive layer 622 forming the gate electrode through the insulating film, and the fourth impurity region (p⁺ region) 641 functioning as a source region or a drain region.

The above TFTs 701 and 702 are appropriately combined to form a shift register circuit, a buffer circuit, a level shifter circuit, a latch circuit and the like, thereby forming the driver circuit 705. For example, in the case where a CMOS circuit is formed, the n-channel TFT 701 and the p-channel TFT 702 may be complementarily connected to each other.

Moreover, the structure of the n-channel TFT 701, which is a GOLD (Gate-drain Overlapped LDD) structure that is formed by overlapping a LDD (Lightly Doped Drain) region with a gate electrode, is appropriate for the circuit in which the reliability takes top priority.

Note that the TFT (n-channel TFT and p-channel TFT) in the driver circuit 705 are required to have a high driving capacity (on current: Ion) and prevent deterioration due to a hot carrier effect to thereby improve reliability. A TFT having a region (GOLD region) where a gate electrode overlaps a low concentration impurity region through a gate insulating film is used as a structure effective in preventing deterioration of an on current value due to hot carriers.

Note that the switching TFT 703 in the pixel portion 706 require a low off current (Ioff). A structure having a region (LDD region) where a gate electrode does not overlap a low concentration impurity region through a gate insulating film is used as a TFT structure for reducing an off current.

In this embodiment's manufacturing steps of light emitting device, source signal line is made from the materials that is used for the gate electrode and the gate signal line is made from the materials for wiring that is used for the source/drain electrodes in considering of the configuration of circuits or the manufacturing steps. But the other materials can be used for those lines.

The driving voltage of TFT is 1.2 to 10 V, preferably 2.5 to 5.5 V in this embodiment.

When the display of the pixel portion is active (case of the moving picture display), a background is displayed by pixels in which the light emitting elements emit light and a character is displayed by pixels in which the light emitting elements do not emit light. However, in the case where the moving picture display of the pixel portion is still for a certain period or more (referred to as a standby time in the present specification), for the purpose of saving electric power, it is appropriate that a display method is changed (inverted). Specifically, a character is displayed by pixels in which light emitting elements emit light (also called a character display), and a background is displayed by pixels in which light emitting elements do not emit light (also called a background display).

Embodiment 5

A case of driving a light emitting device of the present invention by a fixed voltage method is explained next using FIG. 8 and FIGS. 9A to 9C.

Figure 8:
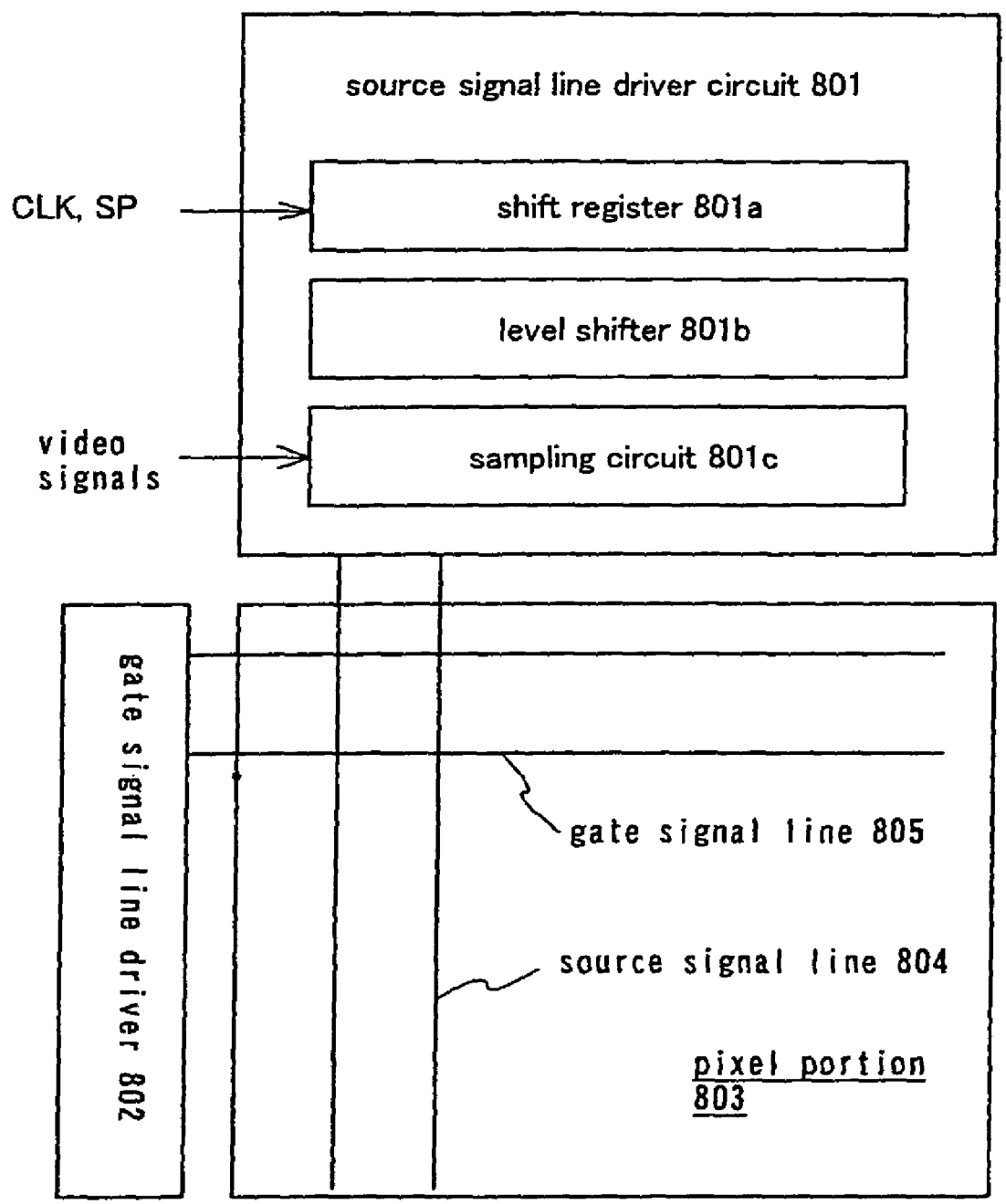
FIG. 8 is a diagram for explaining the constitution of a light emitting device of the present invention.

FIG. 8 is a block diagram of a light emitting device of Embodiment 5. Reference numeral 801 denotes a source signal line driver circuit, reference numeral 802 denotes a gate signal line driver circuit, and reference numeral 803 denotes a pixel portion. One each of the source signal line driver circuit and the gate signal line driver circuit are formed in Embodiment 5, but the present invention is not limited to this structure. Two source signal line driver circuits may also be formed, and two gate signal line driver circuits may also be formed.

The source signal line driver circuit 801 has a shift register 801a, a level shifter 801b, and a sampling circuit 801c. Note that the level shifter 801b may be used when necessary, and does not always need to be used. Further, although a structure is shown in Embodiment 5 in which the level shifter 801b is formed between the shift register 801a and the sampling circuit 801c, the present invention is not limited by this structure. A structure in which the level shifter 801b is incorporated within the shift register 801a may also be employed.

Further, the gate signal line driver circuit 802 has a shift register and a buffer (both not shown in the figure). A level shifter may also be included. Note that a gate signal line 805 is connected to the gate signal line driver circuit 802.

A clock signal (CLK) and a start pulse signal (SP), which are panel control signals, are input to the shift register 801a. A sampling signal for sampling a video signal is output from the shift register 801a. The output sampling signal is input to the level shifter 801b, its electric potential amplitude is increased, and then the signal is output.

The sampling signal output from the level shifter 801b is input to the sampling circuit 801c. A video signal is input to the sampling circuit 801c at the same time, through a video signal line.

The input video signal is sampled in the sampling circuit 801c by the sampling signal, and then input to source signal lines 804.

Figure 9A:
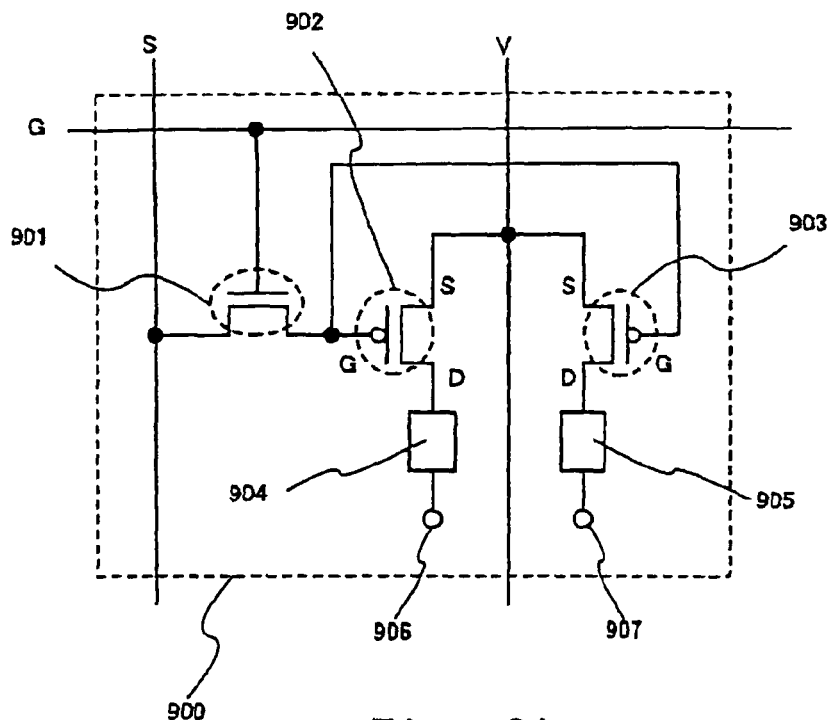
FIGS. 9A to 9C are diagrams for explaining circuit diagrams of a pixel portion of a light emitting device of the present invention.

The structure of a pixel of the pixel portion 803 of the light emitting device shown by FIG. 8 is shown next in FIG. 9A. Note that the pixel portion 803 has a plurality of pixels structured as shown by reference numeral 900 of FIG. 9. The pixel 900 has source signal lines (S), electric current supply lines (V), and a gate signal line (G).

The pixel 900 also has a switching TFT 901, an electric current control TFT (1) 902, an electric current control TFT (2) 903, a light emitting element (1) 904 and a light emitting element (2) 905.

A gate electrode of the switching TFT 901 is connected to a gate signal line (G). Further, one of a source region and a drain region of the switching TFT 901 is connected to a source signal line (S), and the other one of the source region and the drain region is connected to gate electrodes of the electric current control TFT (1) 902 and the electric current control TFT (2) 903.

Source regions of the electric current control TFT (1) 902 and the electric current control TFT (2) 903 are connected to an electric current supply line (V), and a drain region of the electric current control TFT (1) 902 is connected to any one of an anode or a cathode of the light emitting element (1) 904. Further, a drain region of the electric current control TFT (2) 903 is connected to an electrode of a different type (anode or cathode) than that connected to the drain region of electric current control TFT (1) 902. Note that this electrode is one electrode forming the light emitting element (2) 905.

Note that the electrode connected to the drain region of the electric current control TFT (1) 902 is referred to as a pixel electrode (1), and the electrode connected to the drain region of the electric current control TFT (2) 903 is referred to as a pixel electrode (2) throughout this specification. That is, the light emitting element (1) 904 of the pixel 900 has the pixel electrode (1), and the light emitting element (2) 905 has the pixel electrode (2). Further, voltage is input to the pixel electrode (1) and the pixel electrode (2) from the electric current supply lines (V). Note that voltages input from the electric current supply lines (V) are referred to as an electric power source voltage.

Further, the light emitting element (1) 904 and the light emitting element (2) 905 are formed by these pixel electrodes and one more electrode. Note that the additional electrode is referred to as an opposing electrode. In other words, the light emitting element (1) 904 has an opposing electrode (1), and the light emitting element (2) 905 has an opposing electrode (2).

The opposing electrode (1) and the opposing electrode (2) are each maintained at a predetermined voltage, and voltages input from the opposing electrode (1) and the opposing electrode (2) are referred to as opposing voltages in this specification. Note that an electric power source for imparting the opposing voltage to the opposing electrode (1) is referred to as an opposing electric power source (1) 906, and an electric power source for imparting the opposing voltage to the opposing electrode (2) is referred to as an opposing electric power source (2) 907.

A voltage difference between the opposing voltage of the opposing electrode and the electric power source voltage of the pixel electrode is a driver voltage for the light emitting element, and the driver voltage for the light emitting element is applied to an organic compound layer.

Although not shown in the figure, a structure in which a capacitor is formed between a gate electrode of the electric current control TFT (1) 902, and the electric current control TFT (2) 903, and the electric current supply line (V) may also be employed.

Figure 9B:
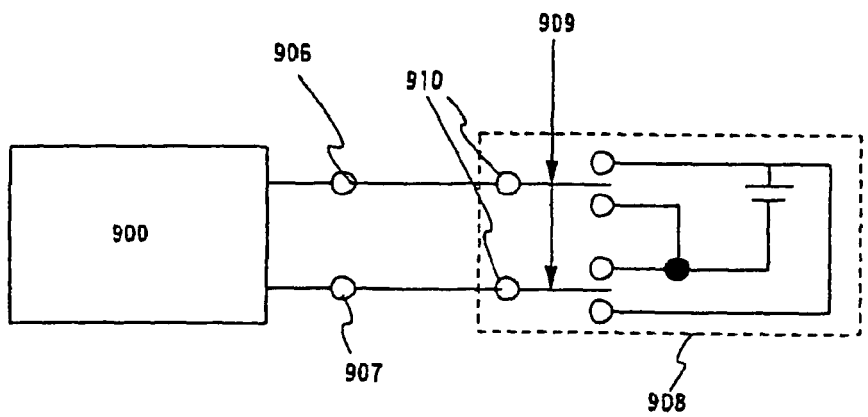

A circuit structure for controlling signals input from the opposing electric power source (1) 906 and the opposing electric power source (2) 907 of the pixel 900 of FIG. 9A is shown in FIG. 9B. That is, a switch 910 is switched, the opposing electric power source (1) 906 or the opposing electric power source (2) 907 is selected, and voltage is input from the selected opposing electric power source by inputting a switching signal 909 to a circuit 908.

Figure 9C:
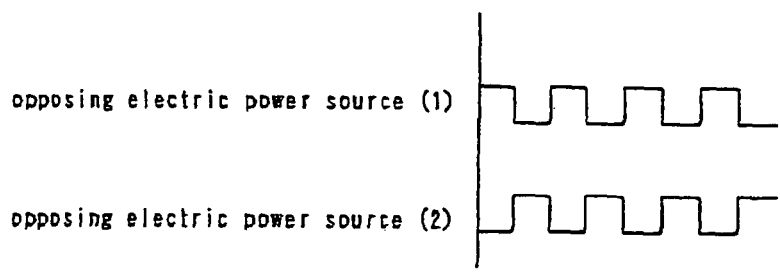

Next, voltages input from the opposing electric power source (1) 906 and the opposing electric power source (2) 907 are each shown in FIG. 9C. That is, there is adopted a structure in which two types of opposing voltages, in which the polarity of the driver voltage for the light emitting element differs, are input alternately from the opposing electric power source (1) 906 and the opposing electric power source (2) 907. Further, voltages input simultaneously from the opposing electric power source (1) 906 and the opposing electric power source (2) 907 differ.

If the switching TFT 901 of the pixel 900 is placed in an on state, the electric current control TFT (1) 902 and the electric current control TFT (2) 903 both are turned on in Embodiment 5. Note that a constant electric power source voltage is input from the electric current supply line (V), and a constant voltage is applied to the pixel electrode (1) and the pixel electrode (2) of the light emitting element (1) 904 and the light emitting element (2) 905, respectively.

If the pixel electrode (1) is formed by an anode here, and the pixel electrode (2) is formed by a cathode, then a desired electric current will flow in the light emitting element (1) 904 because a positive light emitting element driver voltage is applied to the light emitting element (1) 904 in the case where the opposing electric voltage, input to the opposing electrode (1) from the opposing electric power source (1) 906, is lower than the electric power source voltage. A negative light emitting element driver voltage is applied to the light emitting element (1) 904 in the case where the opposing voltage input to the opposing electric electrode (1) is higher than the electric power source voltage, and therefore electric current does not flow in the light emitting element (1) 904. Note that a state in which electric current flows in this manner in the light emitting element is referred to as the light emitting element functioning within this specification.

In contrast, a desired electric current will flow in the light emitting element (2) 905 because a positive light emitting element driver voltage is applied to the light emitting element (2) 905 in the case where the opposing electric voltage, input to the opposing electrode (2) from the opposing electric power source (2) 907, is higher than the electric power source voltage, and the light emitting element (2) functions. A negative light emitting element driver voltage is applied to the light emitting element (2) 905 in the case where the opposing voltage input to the opposing electric electrode (2) is lower than the electric power source voltage, and therefore electric current does not flow in the light emitting element (2) 905, and the light emitting element (2) does not function.

As described above, two types of opposing voltages having inverse polarities of the driver voltage for the light emitting element are thus input alternately from the two types of opposing electric power sources in each of the two types of light emitting elements formed in one pixel, and voltage is only input from any one of the opposing electric power sources. One of the two types of light emitting elements is thus always made to function.

Embodiment 6

Driving a light emitting device of the present invention by a method differing from that disclosed by Embodiment 5 is explained next using FIG. 10 and FIG. 11.

Figure 10:
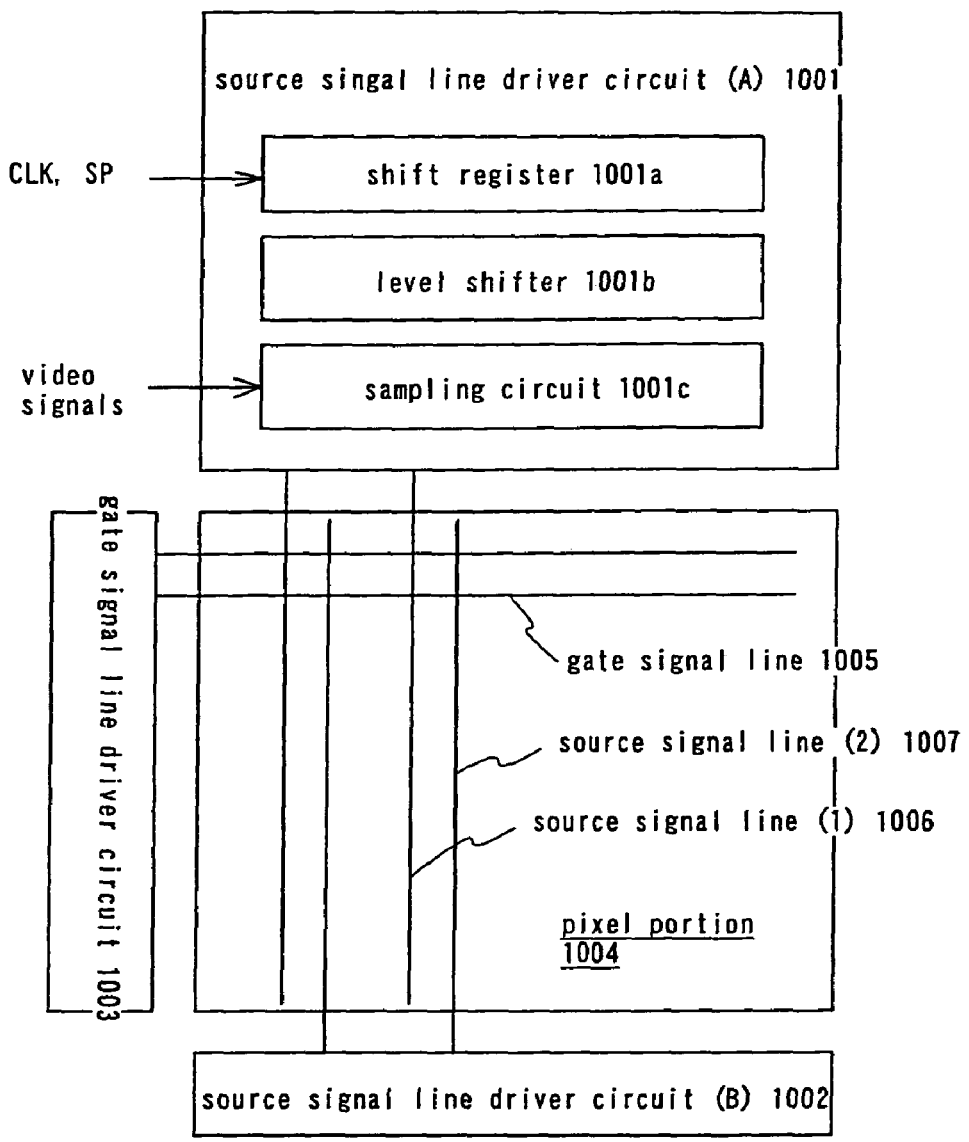
FIG. 10 is a diagram for explaining the constitution of a light emitting device of the present invention.

FIG. 10 shows a block diagram of a light emitting device of Embodiment 6. Reference numeral 1001 denotes a source signal line driver circuit (A), reference numeral 1002 denotes a source signal line driver circuit (B), reference numeral 1003 denotes a gate signal line driver circuit, and reference numeral 1004 denotes a pixel portion.

The source signal line driver circuit (A) 1001 has a shift register 1001a, a level shifter 1001b, and a sampling circuit 1001c. Note that the level shifter 1001b may be used when necessary, and does not always need to be used. Further, although a structure is shown in Embodiment 6 in which the level shifter 1001b is formed between the shift register 1001a and the sampling circuit 1001c, the present invention is not limited by this structure. A structure in which the level shifter 1001b is incorporated within the shift register 1001a may also be employed. Note that the structure of the source signal line driver circuit (B) 1002 can be the same as the structure of the source signal line driver circuit (A) 1001 in Embodiment 6.

Further, the gate signal line driver circuit 1003 has a shift register and a buffer (both not shown in the figure). A level shifter may also be included. Note that a gate signal line 1005 is connected to the gate signal line driver circuit 1003.

A clock signal (CLK) and a start pulse signal (SP), panel control signals, are input to the shift register 1001a. A sampling signal for sampling a video signal is output from the shift register 1001a. The output sampling signal is input to the level shifter 1001b, its electric potential amplitude is increased, and then the signal is output.

The sampling signal output from the level shifter 1001b is input to the sampling circuit 1001c. A video signal is input to the sampling circuit 1001c at the same time, through a video signal line.

The input video signal is sampled in the sampling circuit 1001c by the sampling signal, and then input to source signal lines (1) 1006. Note that processing is performed similarly in the source signal line driver circuit (B) 1002, and its output is then input to source signal lines (2) 1007.

Figure 11:
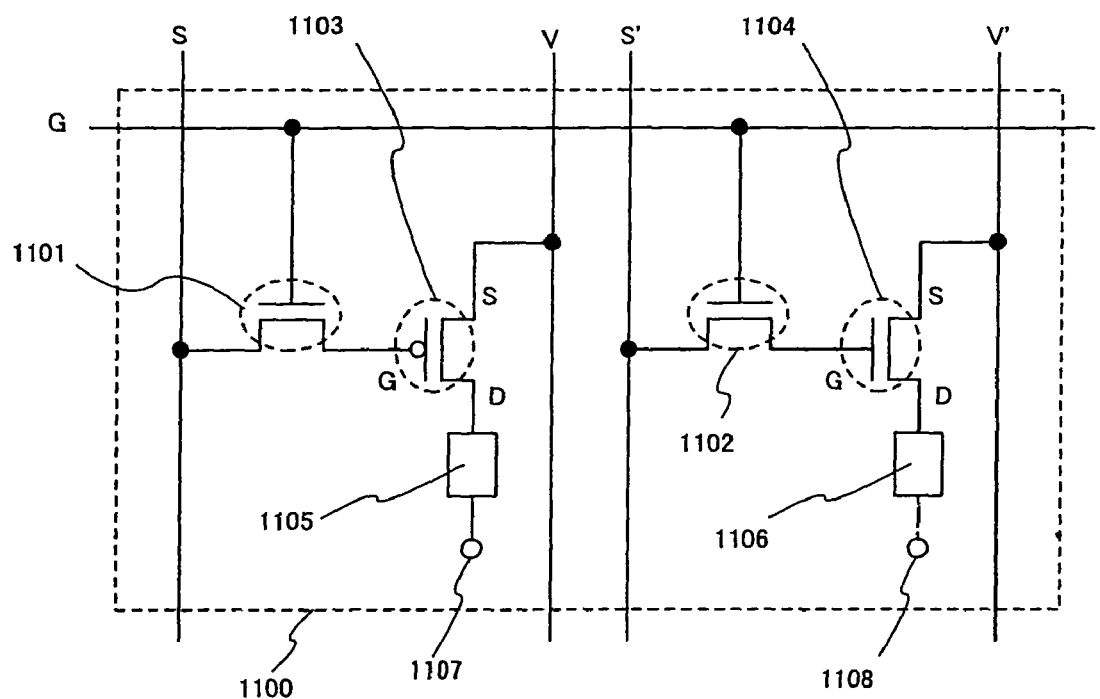
FIG. 11 is a diagram for explaining a circuit diagram of a pixel portion of a light emitting device of the present invention.

The structure of a pixel of the pixel portion 1004 of the light emitting device shown by FIG. 10 is shown next in FIG. 11. Note that the pixel portion 1004 has a plurality of pixels structured as shown by reference numeral 1100 of FIG. 11. The pixel 1100 has two types of source signal lines (S), namely a source signal line (1) (S) and a source signal line (2) (S'), and two types of electric current supply lines (V), namely an electric current supply line (1) (V) and an electric current supply line (2) (V'), and a gate signal line (G).

The pixel 1100 also has two types of switching TFTs, namely a switching TFT (1) 1101 and a switching TFT (2) 1102, two types of electric current control TFTs, namely an electric current control TFT (1) 1103 and an electric current control TFT (2) 1104, and two types of light emitting elements, namely a light emitting element (1) 1105 and a light emitting element (2) 1106.

Gate electrodes of the switching TFT (1) 1101 and the switching TFT (2) 1102 are connected to a gate signal line (G). Further, one of a source region and a drain region of the switching TFT (1) 1101 is connected to a source signal line (1) (S), and the other of the source region and the drain region is connected to a gate electrode of the electric current control TFT (1) 1103. In addition, one of a source region and a drain region of the switching TFT (2) 1102 is connected to a source signal line (2) (S'), and the other of the source region and the drain region is connected to a gate electrode of the electric current control TFT (2) 1104.

A source region of the electric current control TFT (1) 1103 is connected to an electric current supply line (1) (V), and a drain region of the electric current control TFT (1) 1103 is connected to an electrode that becomes an anode or a cathode of the light emitting element (1) 1105. Note that this electrode is one electrode forming the light emitting element (1) 1105. Further, a source region of the electric current control TFT (2) 1104 is connected to the electric current supply line (2) (V'), and a drain region of the electric current control TFT (2) 1104 is connected to an electrode of a different type (anode or cathode) than that connected to the drain region of electric current control TFT (1) 1103. Note that this electrode is the one electrode forming the light emitting element (2) 1106.

Note that the electrode connected to the drain region of the electric current control TFT (1) 1103 is referred to as a pixel electrode (1), and the electrode connected to the drain region of the electric current control TFT (2) 1104 is referred to as a pixel electrode (2) throughout this specification. That is, the light emitting element (1) 1105 of the pixel 1100 has the pixel electrode (1), and the light emitting element (2) 1106 has the pixel electrode (2). Further, voltage is input to the pixel electrode (1) from the electric current supply line (1) (V), and voltage is input to the pixel electrode (2) from the electric current supply line (2) (V'). Note that voltages input from the electric current supply line (1) (V) and the electric current supply line (2) (V') are referred to as an electric power source voltage (1) and an electric power source voltage (2), respectively.

Further, the light emitting element (1) 1105 and the light emitting element (2) 1106 are formed by these pixel electrodes and one more electrode. Note that the additional electrode is referred to as an opposing electrode. In other words, the light emitting element (1) 1105 has an opposing electrode (1), and the light emitting element (2) has an opposing electrode (2).

The opposing electrode (1) and the opposing electrode (2) are each maintained at a predetermined voltage, and voltages input from the opposing electrode (1) and the opposing electrode (2) are referred to as opposing voltages in this specification. Note that an electric power source for imparting the opposing voltage to the opposing electrode (1) is referred to as an opposing electric power source (1) 1107, and an electric power source for imparting the opposing voltage to the opposing electrode (2) is referred to as an opposing electric power source (2) 1108. The opposing electric power source (1) 1107 and the opposing electric power source (2) 1108 are maintained at fixed voltages in Embodiment 6.

Note that it is desirable that the anode voltage be higher than the voltage applied to the cathode. The opposing voltages therefore change depending upon whether the opposing voltages are applied to the anode or to the cathode. For example, it is desirable to set the opposing voltage to be higher than the electric power source voltage if the opposing electrode is the anode. Conversely, it is desirable to make the opposing voltage lower than the electric power source voltage if the opposing electrode is the cathode.

A voltage difference between the opposing voltage of the opposing electrode and the electric power source voltage of the pixel electrode is a driver voltage for the light emitting element, and the driver voltage for the light emitting element is applied to an organic compound layer.

Figure 12:
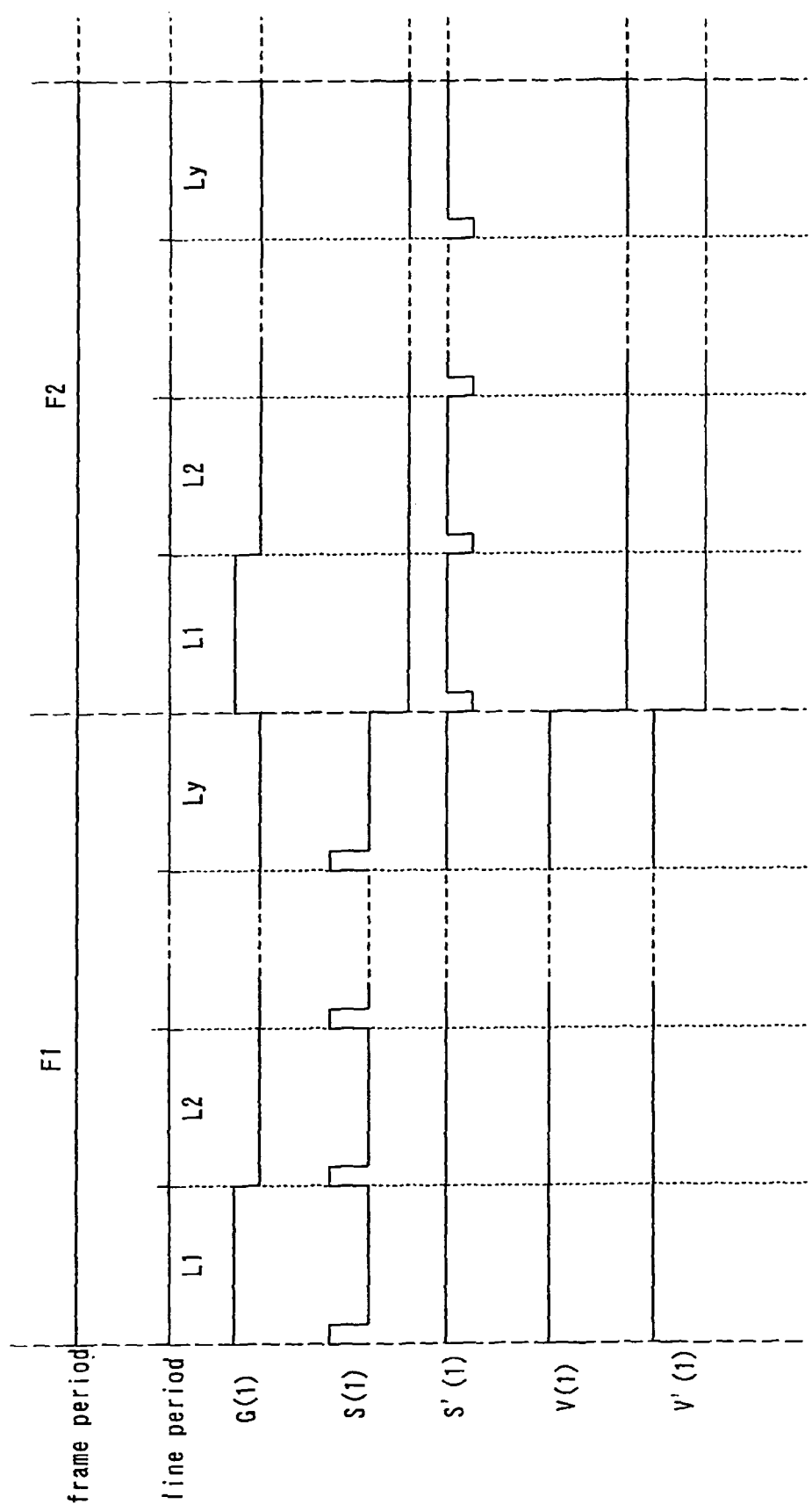
FIG. 12 is a timing chart for a case of driving a light emitting device of the present invention by alternating current.

In addition, a timing chart for a case of driving the light emitting device explained by FIG. 11 is shown in FIG. 12. A period from selection of one gate signal line until the selection of a different gate signal line is referred to as one line period (L). Note that, in this specification, the term selection of a gate signal line denotes a selection signal, having an electric potential therein such that a switching TFT will be placed in an on state, being input to a gate signal line.

Further, a period from display of one image until display of the next image corresponds to one frame period (F). Y line periods (L1, L2, ..., Ly) are formed within one frame period, for example, in a light emitting device having y gate signal lines.

Gate signal lines (G(1), G(2), ..., G(y)) are selected by a selection signal input from the gate signal line driver circuit 1003 in a first line period (L1), and all of the switching TFTs connected to the gate signal line (G) are placed in an on state. A video signal is then input in order to x source signal lines (1) (S(1), S(2), ..., S(x)) from the source signal line driver circuit (A) 1001, and to x source signal lines (2) (S'(1), S'(2), ..., S'(x)) from the source signal line driver circuit (B) 1002. The gate signal line (G(1)), the source signal line (1) (S(1)), and the source signal line (2) (S'(1)) are shown here. Note that the video signal input to the source signal lines (1) (S(1), S(2), ..., S(x)) is input to the gate electrode of the electric current control TFT (1) 1103 through the switching TFT (1) 1101, and the video signal input to the source signal line (2) (S'(1), S'(2), ..., S'(x)) is input to the gate electrode of the electric current control TFT (2) 1194 through the switching TFT (2) 1102.

Further, the electric power source voltage (1) is input to the pixel electrode (1) of each pixel from x electric current supply lines (1) (V(1), V(2), ..., V(x)), and the electric power source voltage (2) is input to the pixel electrodes (2) of each pixel from x electric current supply lines (2) (V'(1), V'(2), ..., V'(x)). The electric current supply line (1) (V(1)) and the electric current supply line (2) (V'(1)) are shown here.

The amounts of electric current flowing in channel formation regions of the electric current control TFT (1) 1103 and the electric current control TFT (2) 1104 are controlled by gate voltages $V_{gs}$, which are voltage differences between the gate electrode and the source region of each of the electric current control TFTs. The voltages imparted to the pixel electrodes of the light emitting element (1) 1105 and the light emitting element (2) 1106 are therefore determined by the size of the voltage of the video signals input to the gate electrode of each electric current control TFT. The light emitting element (1) 1105 and the light emitting element (2) 1106 are therefore controlled by the video signal voltages, and emit light.

The aforementioned operations are repeated, and the first line period (L1) is complete after the video signal is input to the source signal lines (1) (S(1) to , S(2), ..., S(x)) and to the source signal lines (2) (S'(1), S'(2), ..., S'(x)). A second line period (L2) begins next, the gate signal line (G2) is selected by the selection signal, and the video signal is input in order to the source signal lines (1) (S(1), S(2), ..., S(x)) and to the source signal line (2) (S'(1), S'(2), ..., S'(x)), similar to the first line period (L1).

All of the line periods (L1, L2, ..., Ly) are complete when all of the gate signal lines (G1, G2, ..., Gy) have been selected. One frame period (F1) is complete when all of the line periods (L1, L2, ..., Ly) are complete, and then, following frame period (F2) starts. All of the pixels perform display within one frame period, and one image is formed. Note that the electric power source voltage (1) input from the electric current supply line (1) and the electric power source voltage, (2) input from the electric current supply line (2) are switched alternately in Embodiment 6, and therefore the light emitting element (1) 1105 and the light emitting element (2) 1106 thus function alternately along with the input.

The amount of light emission of the light emitting element (1) 1105 and the light emitting element (2) 1106 is thus controlled by the voltage of the video signal, and gray scale display is performed by controlling the amount of light emission.

Embodiment 7

Referring to FIG. 13A and FIG. 13B, the external appearance of an active matrix type light emitting device of the present invention will be described in this embodiment. FIG. 13A is a top view of the luminescent device, and FIG. 13B is a sectional view taken on line A-A' of FIG. 13A. Reference number 1301 represents a source side driving circuit, which is shown by a dotted line; 1302, a pixel section; 1303, a gate side driving circuit; 1304, a sealing substrate; and 1305, a sealant. A space 1307 is surrounded by the sealant 1305.

Reference number 1308 represents an interconnection for transmitting signals inputted to the source signal line driving circuit 1301 and the gate signal line driving circuit 1303. The interconnection 1308 receives video signals and clock signals from a flexible print circuit (FPC) 1309, which will be an external input terminal. Only the FPC is illustrated, but a printed wiring board (PWB) may be attached to this FPC. The light emitting device referred to in the present specification may be the body of the light emitting device, or a product wherein an FPC or a PWB is attached to the body.

The following will describe a sectional structure, referring to FIG. 13B. The driving circuits and the pixel section are formed on the substrate 1310, but the gate side driving circuit 1301 as one of the driving circuits and the pixel section 1302 are shown in FIG. 13B.

In the source signal line driving circuit 1301, a CMOS circuit wherein an n-channel type TFT 1320 and a p-channel type TFT 1321 are combined is formed. The TFTs constituting the driving circuit may be composed of known CMOS circuits, PMOS circuits or NMOS circuits. In this embodiment, a driver-integrated type, wherein the driving circuit is formed on the substrate, is illustrated, but the driver-integrated type may not necessarily be adopted. The driver may be fitted not to the substrate but to the outside.

The pixel section 1302 is composed of plural pixels including a current-controlling TFT 1311 and an anode 1312 electrically connected to the drain of the TFT 1311.

On the both sides of the anode 1312, insulating film 1313 are formed, and a layer comprising at least one organic compound 1314 is formed on the anode 1312. Furthermore, a cathode 1316 is formed on the layer comprising at least one organic compound 1314. In this way, a light emitting element 1318 composed of the anode 1312, the layer comprising at least one organic compound 1314 and the cathode 1316 is formed.

The cathode 1316 also functions as an interconnection common to all of the pixels, and is electrically connected through the interconnection 1308 to the FPC 1309.

In order to seal the light emitting element 1318 formed on the substrate 1310, the sealing substrate 1304 is adhered with the sealant 1305. A spacer made of a resin film may be set up to keep a given interval between the sealing substrate 1304 and the light emitting element 1318. An inert gas such as nitrogen is filled into the space 1307 inside the sealant 1305. As the sealant 1305, an epoxy resin is preferably used. The sealant 1305 is desirably made of a material through which water content or oxygen is transmitted as slightly as possible. Furthermore, it is allowable to incorporate a material having moisture absorption effect into the space 1307.

In this embodiment, as the material making the sealing substrate 1304, there may be used a glass substrate, a quartz substrate, or a plastic substrate made of fiber glass-reinforced plastic (FRP), polyvinyl fluoride (PVF), mylar, polyester or polyacrylic resin. After the adhesion of the sealing substrate 1304 to the substrate with the sealant 1305, a sealant is applied so as to cover the side faces (exposure faces).

As described above, the light emitting element is airtightly put into the space 1307, so that the light emitting element can be completely shut out from the outside and materials promoting deterioration of the layer comprising at least one organic compound, such as water content and oxygen, can be prevented from invading this layer from the outside. Consequently, the light emitting device can be made highly reliable.

The structure of this embodiment may be freely combined with the structure of Embodiments 1 to 6.

Embodiment 8

Figure 14:
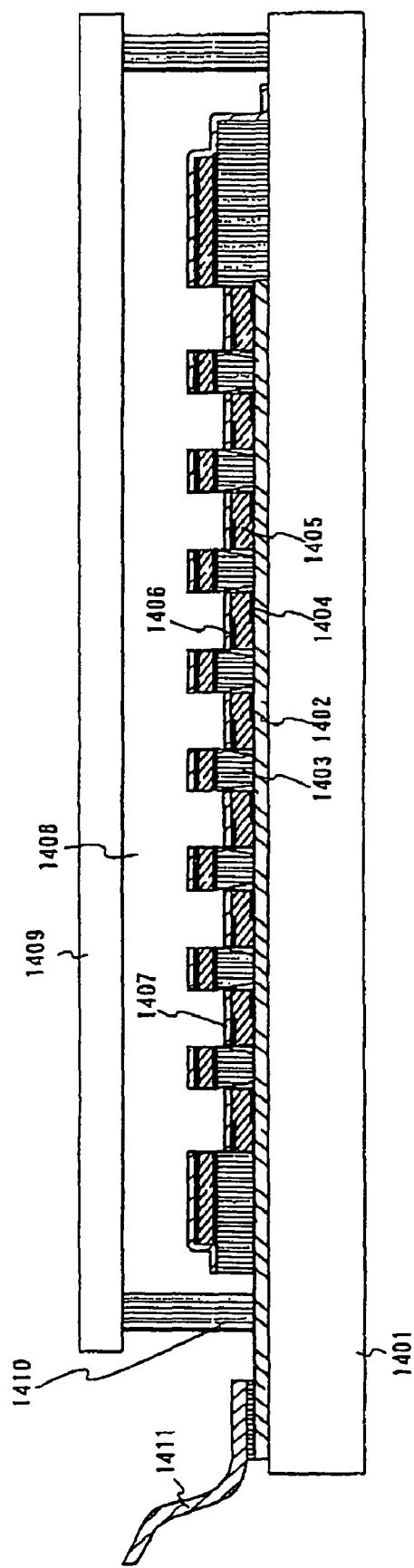
FIG. 14 is a diagram for explaining a passive matrix light emitting device.
Figure 16A:
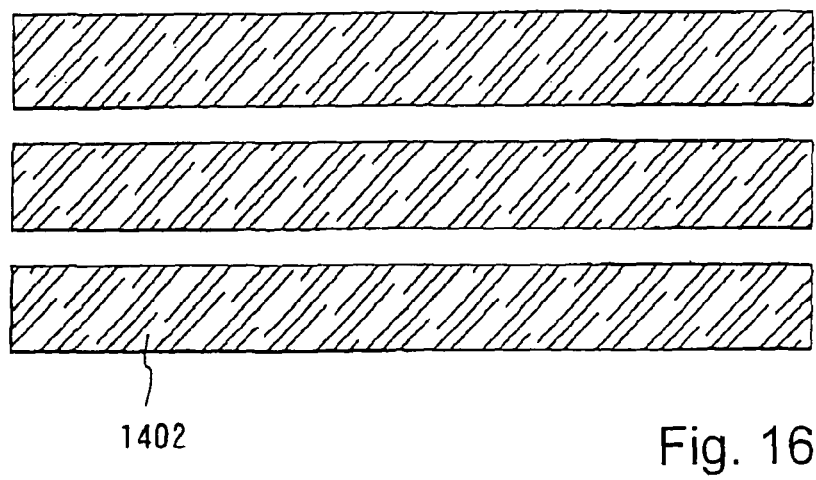
FIGS. 16A to 16E correspond to top views of FIG. 14.

In this embodiment, a case in which a passive type (simple matrix type) light emitting device having an element structure of the present invention is manufactured is described with reference to FIG. 14 and FIGS. 16A to 16E. In FIG. 14, reference numbers 1401 and 1402 represent a glass substrate and a first electrode made of materials for anode, respectively. In this embodiment, ITO is formed by sputtering as a first electrode 1402, as shown in FIG. 16A. Not shown in FIG. 14, plural first electrodes are arranged in the stripe form in parallel with the paper.

Figure 16B:
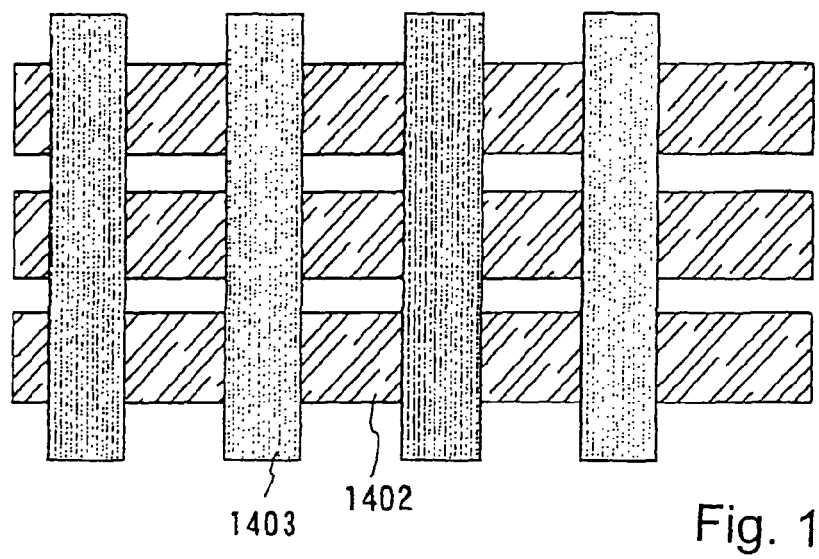

As shown in FIG. 16B, banks 1403 made of an insulating material are formed to cross the first electrode 1402 arranged in the stripe form. As shown in FIG. 14, the banks 1403 are formed perpendicularly to the paper face to contact the anode 1402.

Figure 16C:
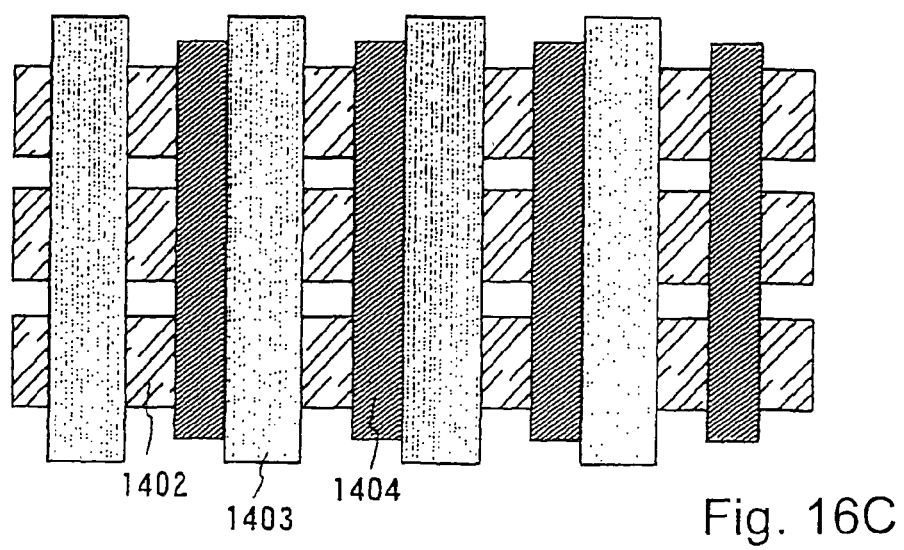

Next, as shown in FIG. 16C, a first assistant electrode 1404 is formed on the exposed portion of first electrode 1402 by vapor deposition. As the material, which makes the first assistant electrode 1404, a material that can be used as cathodes, described in Embodiments 1 to 3, can be used. Further, there are no problems if such materials formed on the banks, when the first assistant electrode 1404 is formed.

Next, a layer comprising at least one organic compound 1405 is formed on the first electrode 1402 and the first assistant electrode 1404. As the materials for forming the layer composing at least one organic compound 1405, the materials described in the embodiments 1 to 3 can be used.

For example, by forming a layer comprising at least one organic compound giving red luminescence, a layer comprising at least one organic compound giving green luminescence, and a layer comprising at least one organic compound giving blue luminescence, a light emitting device giving three types of luminescence rays can be formed. Since the layer comprising at least one organic compound 1405 composed of these layers is formed along grooves made in the banks 1403, the layer 1405 is arranged in the stripe form perpendicular to the paper face.

Figure 16D:
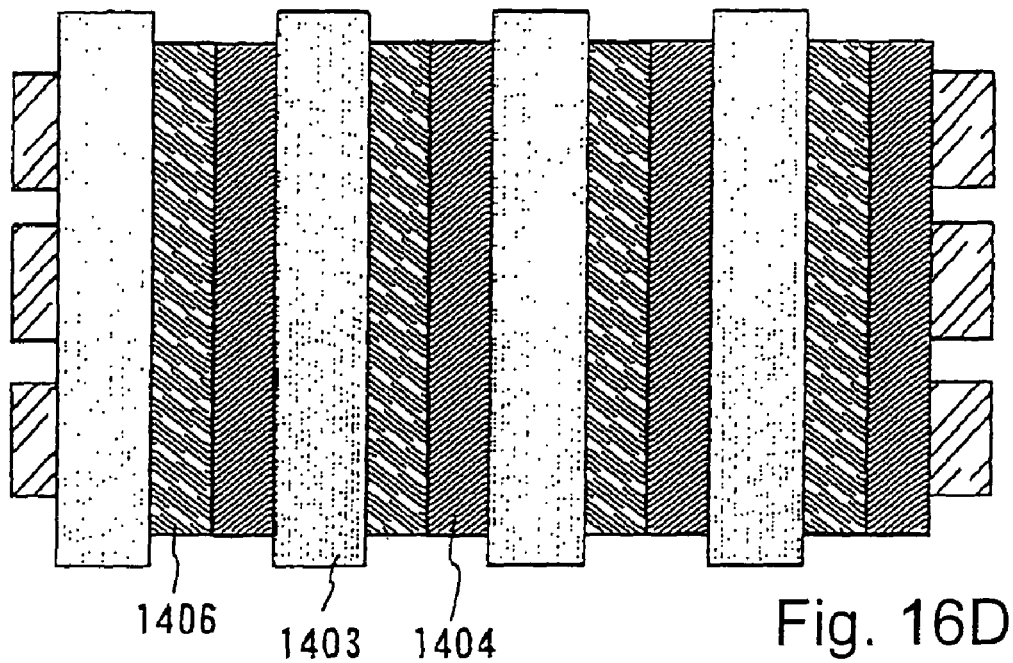

Next, as shown in FIG. 16D, a second assistant electrode 1406 is formed on the layer comprising at least one organic compound 1405 not to overlap the first assistant electrode 1404. The second assistant electrode 1406 is formed using the same materials as the first assistant electrode.

Figure 16E:
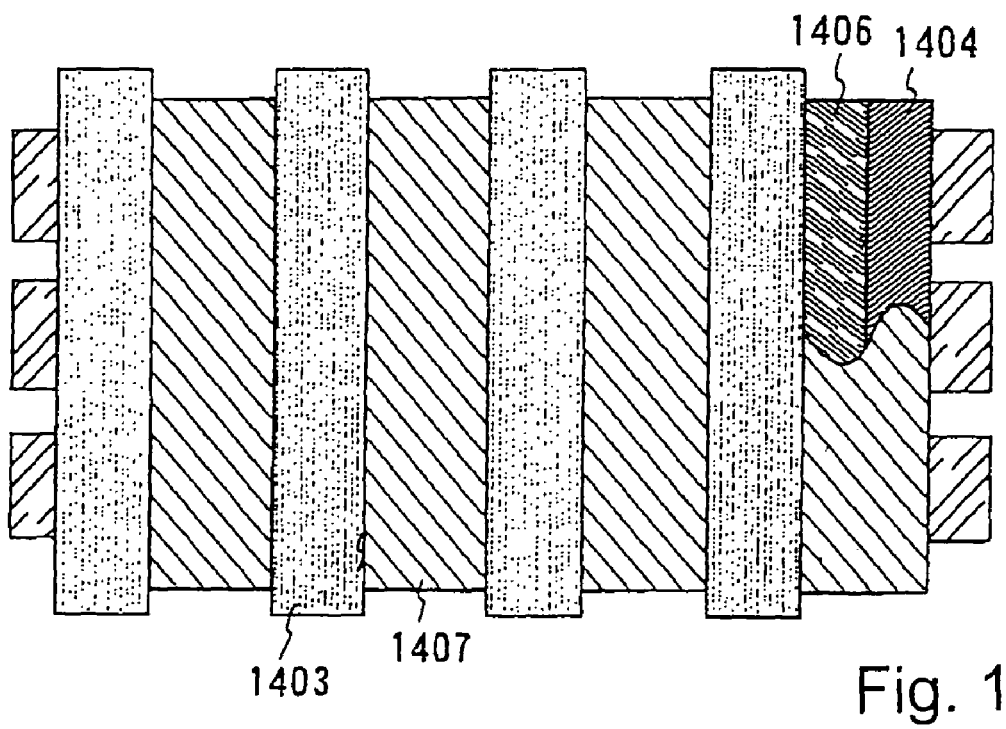

Next, as shown in FIG. 16E, a second electrode 1407 is formed on the layer comprising at least one organic compound 1405 and the second assistant electrode 1406. In this embodiment, the second electrode 1407 is formed using the transparency materials by vapor deposition.

Since the lower first electrodes 1402 are transparent materials in this embodiment, light generated at the layer comprising at least one organic compound 1405 is radiated downward (to the substrate 1401 side).

Next, a glass substrate is prepared as a sealing substrate 1409. A substrate made of plastic or quartz may be used as well as glass substrate in this embodiment. Further, opaque materials can be used.

The sealing substrate 1409 is adhered to the substrate 1401 with a sealant 1410 made of an ultraviolet hardening resin. The inside 1408 of the sealant 1410 is an airtightly-closed space, and the inside is filled with an inert gas such as nitrogen or argon. It is effective to put a moisture absorbent, a typical example of which is barium oxide, in the airtightly closed space 1408. At last, a flexible printed circuit (FPC) 1411 is fitted to the anodes to complete a passive type light emitting device.

This embodiment may be carried out by combining materials except the element structure (active matrix type) shown in Embodiments 1 to 4.

Embodiment 9

Being self-luminous, a light emitting device using a light emitting element has better visibility in bright places and wider viewing angle than liquid crystal display devices. Therefore, various electric appliances can be completed by using the light emitting device of the present invention.

Given as examples of an electric appliance that employs a light emitting device manufactured in accordance with the present invention are video cameras, digital cameras, goggle type displays (head mounted displays), navigation systems, audio reproducing devices (such as car audio and audio components), notebook computers, game machines, portable information terminals (such as mobile computers, cellular phones, portable game machines, and electronic books), and image reproducing devices equipped with recording media (specifically, devices with a display device that can reproduce data in a recording medium such as a digital video disk (DVD) to display an image of the data). Wide viewing angle is important particularly for portable information terminals because their screens are often slanted when they are looked at. Therefore it is preferable for portable information terminals to employ the light emitting device using the light emitting element. Specific examples of these electric appliance are shown in FIGS. 16A to 16H.

Figure 15A:
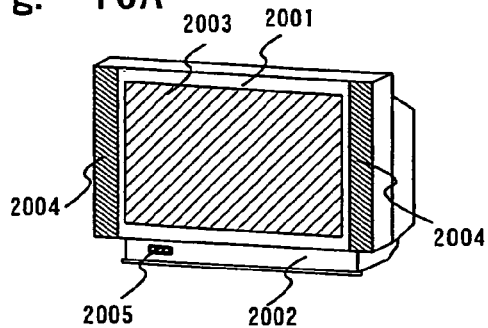
FIGS. 15A to 15H are diagrams showing examples of electronic equipment.

FIG. 15A shows a display device, which is composed of a case 2001, a support base 2002, a display unit 2003, speaker units 2004, a video input terminal 2005, etc. The light emitting device manufactured in accordance with the present invention can be applied to the display unit 2003. Since the light emitting device having the light emitting element is self-luminous, the device does not need back light and can make a thinner display unit than liquid crystal display devices. The display device refers to all display devices for displaying information, including ones for personal computers, for TV broadcasting reception, and for advertisement.

Figure 15B:
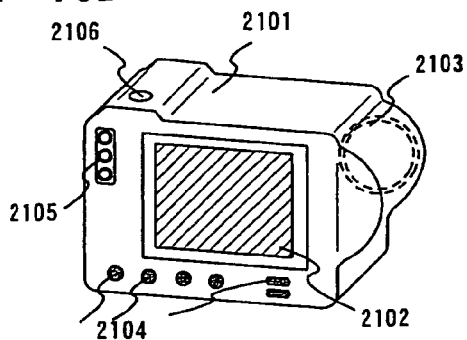

FIG. 15B shows a digital still camera, which is composed of a main body 2101, a display unit 2102, an image receiving unit 2103, operation keys 2104, an external connection port 2105, a shutter 2106, etc. The light emitting device manufactured in accordance with the present invention can be applied to the display unit 2102.

Figure 15C:
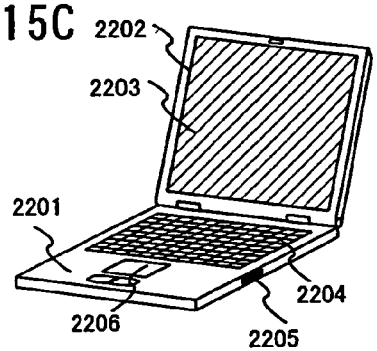

FIG. 15C shows a notebook personal computer, which is composed of a main body 2201, a case 2202, a display unit 2203, a keyboard 2204, an external connection port 2205, a pointing mouse 2206, etc. The light emitting device manufactured in accordance with the present invention can be applied to the display unit 2203.

Figure 15D:
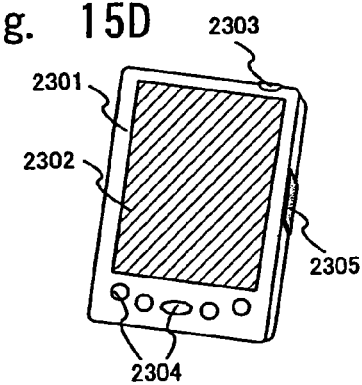

FIG. 15D shows a mobile computer, which is composed of a main body 2301, a display unit 2302, a switch 2303, operation keys 2304, an infrared port 2305, etc. The light emitting device manufactured in accordance with the present invention can be applied to the display unit 2302.

Figure 15E:
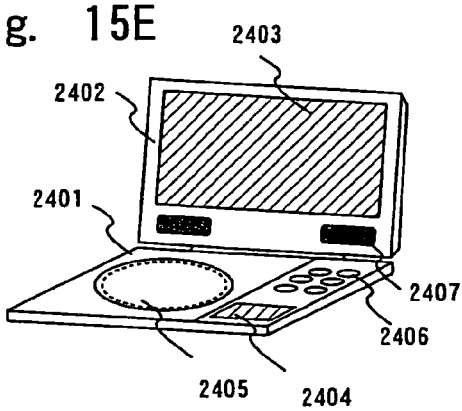

FIG. 15E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The light emitting device manufactured in accordance with the present invention can be applied to the display units A 2403 and B 2404. The image reproducing device equipped with a recording medium also includes home-video game machines.

Figure 15F:
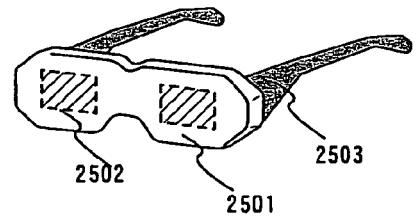

FIG. 15F shows a goggle type display (head mounted display), which is composed of a main body 2501, display units 2502, and arm units 2503. The light emitting device manufactured in accordance with the present invention can be applied to the display units 2502.

Figure 15G:
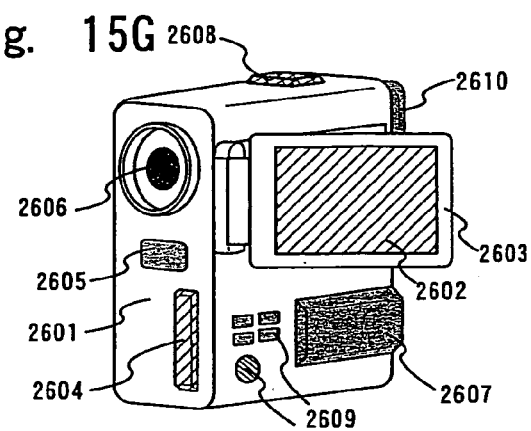

FIG. 15G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The light emitting device manufactured in accordance with the present invention can be applied to the display unit 2602.

Figure 15H:
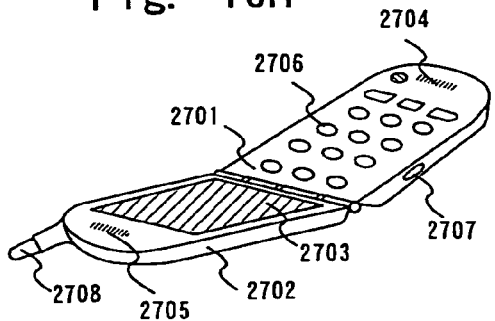

FIG. 15H shows a cellular phone, which is composed of a main body 2701, a case 2702, a display unit 2703, an audio input unit 2704, an audio output unit 2705, operation keys 2706, an external connection port 2707, an antenna 2708, etc. The light emitting device manufactured in accordance with the present invention can be applied to the display unit 2703. If the display unit 2703 displays white letters on black background, the cellular phone consumes less power.

If the luminance of light emitted from organic materials is raised in future, the light emitting device can be used in front or rear projectors by enlarging outputted light that contains image information through a lens or the like and projecting the light.

These electric appliances now display with increasing frequency information sent through electronic communication lines such as the Internet and CATV (cable television), especially, animation information. Since organic materials have very fast response speed, the light emitting device is suitable for animation display.

In the light emitting device, light emitting portions consume power and therefore it is preferable to display information in a manner that requires less light emitting portions. When using the light emitting device in display units of portable information terminals, particularly cellular phones and audio reproducing devices that mainly display text information, it is preferable to drive the device such that non-light emitting portions form a background and light emitting portions form text information.

As described above, the application range of the light emitting device manufactured by using the deposition device of the present invention is so wide that it is applicable to electric appliances of any field. The electric appliances of this embodiment can be completed by using the light emitting device formed by implementing Embodiments 1 to 8.

Charge accumulation in an organic compound layer, which becomes a problem with direct current drive, can be prevented in the present invention by manufacturing an alternating current drive light emitting device. A problem in that light emitting element brightness drops is thus solved, and it therefore becomes possible to improve the element characteristics of light emitting elements, and provide then with longer life. Further, two types of light emitting elements having different structures are formed in the light emitting device of the present invention. This is a structure in which any one of the light emitting elements will always function, even if voltages having different polarities are applied during alternating current drive, and therefore gray scale display similar to that of direct current drive can be performed.

What is claimed is:

1. A light emitting device comprising:
   a source wiring; and
   a pixel, said pixel comprising:
      a first transistor having a first gate electrode;
      a first pixel electrode connected to the first transistor;
      a second transistor having a second gate electrode;
      a second pixel electrode connected to the second transistor; and
      a third transistor,
   wherein the first gate electrode and the second gate electrode are connected to each other, and
   wherein said third transistor is connected between the source wiring, and both the first gate electrode and the second gate electrode.

2. A light emitting device comprising:
   a first thin film transistor;
   a second thin film transistor;
   an interlayer insulating film formed over the first thin film transistor and the second thin film transistor;
   a first pixel electrode over the interlayer insulating film, wherein said first pixel electrode is connected to the first thin film transistor;
   a second pixel electrode over the interlayer insulating film, wherein said second pixel electrode is connected to the second thin film transistor;
   an insulating layer with an opening, wherein at least a portion of the first pixel electrode and at least a portion of the second pixel electrode are exposed in the opening;
   a layer comprising an organic compound over the first pixel electrode and the second pixel electrode;
   a counter electrode over the layer comprising the organic compound.

3. A light emitting device comprising:
   a source wiring; and
   a pixel, said pixel comprising:
      a first thin film transistor having a first gate electrode;
      a second thin film transistor having a second gate electrode;
      an interlayer insulating film formed over the first thin film transistor and the second thin film transistor;
      a first pixel electrode over the interlayer insulating film, wherein said first pixel electrode is connected to the first thin film transistor;
      a second pixel electrode over the interlayer insulating film, wherein said second pixel electrode is connected to the second thin film transistor;
      an insulating layer with an opening, wherein at least a portion of the first pixel electrode and at least a portion of the second pixel electrode are exposed in the opening;
      a layer comprising an organic compound over the first pixel electrode and the second pixel electrode;

a counter electrode over the layer comprising the organic compound; and a third thin film transistor, wherein the first gate electrode and the second gate electrode are connected to each other, and wherein said third transistor is connected between the source wiring, and both the first gate electrode and the second gate electrode.

4. The light emitting device according to claim 1 further comprising:

a layer comprising an organic compound over the first pixel electrode and the second pixel electrode, wherein the layer comprising the organic compound has bipolar characteristics.

5. The light emitting device according to claim 1 further comprising:

a layer comprising an organic compound over the first pixel electrode and the second pixel electrode, wherein the layer comprising the organic compound comprises a material having hole transporting characteristics and a material having electron transporting characteristics.

6. The light emitting device according to claim 2, wherein the layer comprising the organic compound has bipolar characteristics.

7. The light emitting device according to claim 2, wherein the layer comprising the organic compound comprises a material having hole transporting characteristics and a material having electron transporting characteristics.

8. The light emitting device according to claim 2, wherein the first pixel electrode is transparent, and wherein the second pixel electrode is transparent.

9. The light emitting device according to claim 2, wherein the counter electrode is transparent.

10. The light emitting device according to claim 3, wherein the layer comprising the organic compound has bipolar characteristics.

11. The light emitting device according to claim 3, wherein the layer comprising the organic compound comprises a material having hole transporting characteristics and a material having electron transporting characteristics.

12. The light emitting device according to claim 3, wherein the first pixel electrode is transparent, and wherein the second pixel electrode is transparent.

13. The light emitting device according to claim 3, wherein the counter electrode is transparent.

* * * * *

UNITED STATES PATENT AND TRADEMARK OFFICE
CERTIFICATE OF CORRECTION

PATENT NO. : 7,759,686 B2
APPLICATION NO. : 11/907425
DATED : July 20, 2010
INVENTOR(S) : Shunpei Yamazaki et al.

Page 1 of 1

It is certified that error appears in the above-identified patent and that said Letters Patent is hereby corrected as shown below:

At column 11, line 8, please change "joulolidine" to -- julolidine --;

At column 20, line 34, please change "mm/min" to -- nm/min --;

At column 21, line 28, please change "n‴" to -- n¨ --;

At column 22, line 15, please change "n‴" to -- n¨ --;

At column 23, line 26, please change "n‴" to -- n¨ --;

At column 23, line 31, please change "n‴" to -- n¨ --;

At column 29, line 53, please change "(S(1) to , S(2),...,S(x))" to -- (S(1), S(2),...,S(x)) --.

Signed and Sealed this
Eighth Day of February, 2011

David J. Kappos
*Director of the United States Patent and Trademark Office*